United States Patent
Ito

(10) Patent No.: US 11,202,401 B2
(45) Date of Patent: Dec. 14, 2021

(54) COMPONENT MOUNTING DEVICE

(71) Applicant: Yamaha Hatsudoki Kabushiki Kaisha, Iwata (JP)

(72) Inventor: Kota Ito, Iwata (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 367 days.

(21) Appl. No.: 16/347,798

(22) PCT Filed: Nov. 8, 2016

(86) PCT No.: PCT/JP2016/083073
§ 371 (c)(1),
(2) Date: May 6, 2019

(87) PCT Pub. No.: WO2018/087809
PCT Pub. Date: May 17, 2018

(65) Prior Publication Data
US 2019/0261542 A1    Aug. 22, 2019

(51) Int. Cl.
*H05K 13/08* (2006.01)
*G06K 7/14* (2006.01)
*H05K 13/04* (2006.01)

(52) U.S. Cl.
CPC ......... *H05K 13/087* (2018.08); *G06K 7/1417* (2013.01); *H05K 13/0409* (2018.08);
(Continued)

(58) Field of Classification Search
CPC ........... H05K 13/0404; H05K 13/0406; H05K 13/0408; H05K 13/0409; H05K 13/041;
(Continued)

(56) References Cited

U.S. PATENT DOCUMENTS

2010/0263203 A1    10/2010   Ban et al.
2017/0325370 A1*   11/2017   Nozawa ............. H05K 13/0812

FOREIGN PATENT DOCUMENTS

JP    2009-283572 A    12/2009
JP    2010-092955 A    4/2010
(Continued)

OTHER PUBLICATIONS

Machine translation of description section of JP 2016-076579 provided by EPO website (Espacenet.com) retrieved on Jun. 29, 2021 (Year: 2021).*

(Continued)

*Primary Examiner* — Peter Dungba Vo
*Assistant Examiner* — Joshua D Anderson
(74) *Attorney, Agent, or Firm* — Studebaker & Brackett PC

(57) ABSTRACT

A component mounting device mounts an electronic component on a printed circuit board, and includes a sideview camera which takes an image of a side surface of a target, a mounting head having a nozzle shaft, and a driving device which moves the mounting head to a planar direction on a base. The nozzle shaft includes a shaft main body movably supported to a vertical direction with respect to the mounting head, and a suction nozzle attached at a tip of the shaft main body to suction and hold the electronic component, and an identification mark which identifies the suction nozzle is provided on a side surface of the suction nozzle.

8 Claims, 22 Drawing Sheets

(52) U.S. Cl.
CPC .................. *H05K 13/0812* (2018.08); *H05K 2201/09927* (2013.01); *Y10T 29/53191* (2015.01)

(58) Field of Classification Search
CPC ........... H05K 13/0413; H05K 13/0812; H05K 13/0813; H05K 13/087; H05K 2201/09927; Y10T 29/49131; Y10T 29/49133; Y10T 29/53174; Y10T 29/53178; Y10T 29/53191; G06K 7/1417
See application file for complete search history.

(56) References Cited

FOREIGN PATENT DOCUMENTS

| | | |
|---|---|---|
| JP | 2016-076579 A | 5/2016 |
| WO | 2015/059749 A1 | 4/2015 |

OTHER PUBLICATIONS

An Office Action issued by the State Intellectual Property Office of the People's Republic of China dated Mar. 19, 2020, which corresponds to Chinese Patent Application No. 201680090294.9 and is related to U.S. Appl. No. 16/347,798 with English language translation.
International Search Report issued in PCT/JP2016/083073; dated Feb. 14, 2017.

\* cited by examiner

| IMAGE-TAKING TARGET | POSITION OF NOZZLE SHAFT | LIGHTING | LIT-UP PATTERN | |
|---|---|---|---|---|
| ELECTRONIC COMPONENT | INITIAL POSITION S1 | TRANSMISSION | LIGHT SOURCES 180a: GREEN | |
| | | | LIGHT SOURCES 180b: RED | |
| TWO-DIMENSIONAL CODE | READ POSITION S2 | REFLECTION | LIGHT SOURCES 180a: RED | |
| | | | LIGHT SOURCES 180b: GREEN | |

FIG.18

|   | ID INFORMATION | CORRECTION VALUE K |
|---|---|---|
| 1 | aaaa1111 | K1 |
| 2 | aaaa2222 | K2 |
| 3 | aaaa3333 | K3 |
| 4 | aaaa4444 | K4 |
| 5 | aaaa5555 | K5 |
| 6 | aaaa6666 | K6 |
| 7 | aaaa7777 | K7 |
| 8 | aaaa8888 | K8 |
| 9 | aaaa9999 | K9 |
| ⋮ | ⋮ | ⋮ |
| 16 | | |
| 17 | | |
| 18 | | |

FIG.19

| | ID INFORMATION | TYPE | MAINTENANCE TIME |
|---|---|---|---|
| 1 | aaaa1111 | A TYPE | MARCH 1 |
| 2 | aaaa2222 | A TYPE | MARCH 1 |
| 3 | aaaa3333 | A TYPE | MARCH 1 |
| 4 | aaaa4444 | B TYPE | MARCH 10 |
| 5 | aaaa5555 | B TYPE | MARCH 10 |
| 6 | aaaa6666 | B TYPE | MARCH 10 |
| 7 | aaaa7777 | C TYPE | MARCH 21 |
| 8 | aaaa8888 | C TYPE | MARCH 21 |
| 9 | aaaa9999 | C TYPE | MARCH 21 |
| | ⋮ | ⋮ | ⋮ |
| 16 | | | |
| 17 | | | |
| 18 | | | |

COMPONENT MOUNTING DEVICE

CROSS-REFERENCE TO RELATED APPLICATION

This application is a National Stage of International Patent Application No. PCT/JP2016/083073, filed Nov. 8, 2016, the entire content of which is incorporated herein by reference.

BACKGROUND

Technical Field

The technology disclosed in the specification relates to a component mounting device.

Background Art

Conventionally, a component mounting device for mounting electronic components on a printed circuit board has been known. The component mounting device includes a mounting head having a nozzle shaft movable to a vertical direction. The nozzle shaft has a suction nozzle attached at its tip, and has a structure to hold an electronic component with negative pressure.

As described in Japanese Unexamined Patent Application Publication No. 2010-92955, an identification mark is printed on an upper surface of a flange part of the suction nozzle and this is subjected to image recognition from above, thereby allowing the suction nozzle to be identified.

SUMMARY

However, the identification mark printed on the upper surface of the flange part cannot be recognized unless the suction nozzle is in a state of being removed from a shaft main body.

The technology disclosed in the specification thus allows recognition of information even if the suction nozzle remains assembled to the shaft main body.

The component mounting device disclosed in the specification is a component mounting device which mounts an electronic component on a printed circuit board. The component mounting device includes a sideview camera which takes an image of a side surface of a target, a mounting head having a nozzle shaft, and a driving device which moves the mounting head to a planar direction on a base. The nozzle shaft includes a shaft main body movably supported to a vertical direction with respect to the mounting head, and a suction nozzle attached at a tip of the shaft main body to suction and hold the electronic component, and an identification mark which identifies the suction nozzle is provided on a side surface of the suction nozzle.

In the present structure, the identification mark is provided on the side surface of the suction nozzle. Therefore, even if the suction nozzle remains attached to the shaft main body, an image of the identification mark can be taken by the sideview camera.

As one embodiment of the component mounting device disclosed in the specification, the sideview camera is arranged on the mounting head, and takes an image of the identification mark of the suction nozzle. In this structure, the image of the identification mark can be taken by the sideview camera during movement of the mounting head.

As one embodiment of the component mounting device disclosed in the specification, the nozzle shaft vertically moves with respect to the mounting head between a first position where an image of the electronic component held by the suction nozzle can be taken by the sideview camera and a second position where the image of the identification mark attached to the side surface of the suction nozzle can be taken by the sideview camera. In this structure, by adjusting the vertical position of the nozzle shaft, the images of both of the electronic component and the identification mark can be taken by one sideview camera.

As one embodiment of the component mounting device disclosed in the specification, the mounting head is a rotary-type mounting head including a rotator having a plurality of said nozzle shafts arranged in a circumferential direction, and a support member rotatably supporting the rotator, and the sideview camera is attached to the support member. In this structure, by rotating the rotator, the position of each nozzle shaft in the circumferential direction with respect to the sideview camera can be adjusted.

As one embodiment of the component mounting device disclosed in the specification, the identification mark is a two-dimensional code. In this structure, a relatively large amount of information can be written.

According to the technology disclosed in the specification, information can be recognized even if the suction nozzle remains assembled to the shaft main body.

BRIEF DESCRIPTION OF THE DRAWINGS

FIG. 18 is a diagram depicting stored contents in a storage unit;

FIG. 19 is a diagram depicting stored contents in a management device;

DETAILED DESCRIPTION

First Embodiment

1. Entire Structure of the Component Mounting Device

Figure 1:
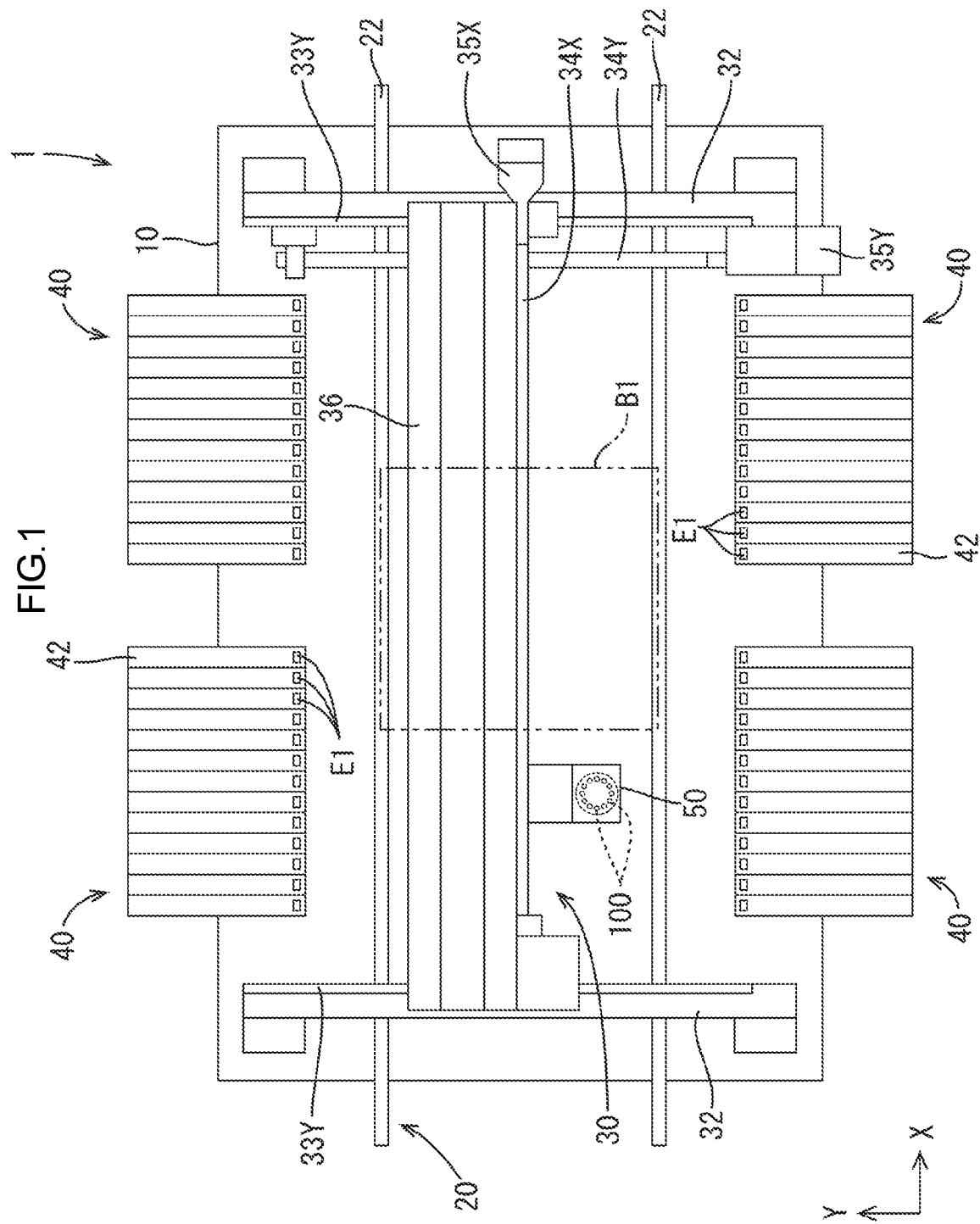
FIG. 1 is a plan view of a component mounting device applied to a first embodiment.

FIG. 1 is a plan view of a component mounting device 1. The component mounting device 1 includes a base 10, a carrier conveyer 20 for carrying a printed circuit board B1, a head unit 50, a driving device 30 which moves the head unit 50 to a planar direction (XY axis direction), component supply units 40, and so forth. Note that the head unit 50 is one example of a "mounting head" of the present disclosure.

The base 10 forms a rectangular shape in a planar view, with an upper surface made flattened. Also, below the carrier conveyer 20 on the base 10, a backup device (omitted in the drawing) is provided, which backs up the printed circuit board B1 when an electronic component E1 is placed on the printed circuit board B1. In the following description, it is assumed that a carrying direction of the printed circuit board B1 (lateral direction in FIG. 1) is an X-axis direction, a short-side direction (vertical direction in FIG. 1) of the base 10 is a Y-axis direction, and the vertical direction is a Z-axis direction.

The carrier conveyer 20 is arranged at a substantially center position of the base 10 in the Y-axis direction, and carries the printed circuit board B1 along the X-axis direction. The carrier conveyer 20 includes paired conveyer belts 22 for driving to the X direction as the carrying direction in a circulating manner. The printed circuit board B1 is carried from one side (right side depicted in FIG. 1) of the carrying direction along the conveyer belts 22 into a work position (position surrounded by a two-dot-chain line in FIG. 1) on the base 10. Then, after the printed circuit board stops at the work position and the work of placing the electronic component E1 is performed, the printed circuit board is carried out along the conveyer belts 22 to the other side (left side depicted in FIG. 1).

The component supply units 40 are disposed at two locations aligned in the X-axis direction on both sides of the carrier conveyer 20 (both upper and lower sides of FIG. 1), that is, four locations in total. To these component supply units 40, a plurality of feeders 42 are attached so as to be aligned laterally. Each feeder 42 includes a reel around which a component supply tape having a plurality of electronic components E1 accommodated thereon is wound and a motorized delivery device which pulls out the component supply tape from the reel, supplying the electronic components E1 one by one.

The driving device 30 is configured of paired support frames 32 and a head driving mechanism. The paired support frames 32 are positioned on both sides of the base 10 in the X-axis direction, and extends to the Y-axis direction. The support frames 32 are provided with an X-axis servo mechanism and a Y-axis servo mechanism which configure the head driving mechanism. The head unit 50 can move to the X-axis direction and the Y-axis direction in a movable area on the base 10 by the X-axis servo mechanism and the Y-axis servo mechanism.

The Y-axis servo mechanism has paired Y-axis guide rails 33Y, a head support 36, a Y-axis ball screw 34Y, and a Y-axis servo motor 35Y. The head support 36 is slidably supported by the paired Y-axis guide rails 33Y to the Y-axis direction. To the head support 36, a ball nut (omitted in the drawing) which is screwed to the Y-axis ball screw 34Y is fixed.

When the Y-axis servo motor 35Y is driven, the ball nut proceeds and recedes along the Y-axis ball screw 34Y and, as a result, the head support 36 and the head unit 50, which is described further below, move to the Y-axis direction along the Y-axis guide rails 33Y.

The X-axis servo mechanism has an X-axis guide rail (not depicted in the drawing) attached to the head support 36, an X-axis ball screw 34X, and an X-axis servo motor 35X. To the X-axis guide rail, the head unit 50 is movably attached along its axial direction. To the head unit 50, a ball nut (omitted in the drawing) which is screwed wo the X-axis ball screw 34X is attached.

When the X-axis servo motor 35X is driven, the ball nut proceeds and recedes along the X-axis ball screw 34X and, as a result, the head unit 50 fixed to the ball nut moves to the X-axis direction along the X-axis guide rail on the head support 36.

(Structure of the Head Unit)

Figure 2:
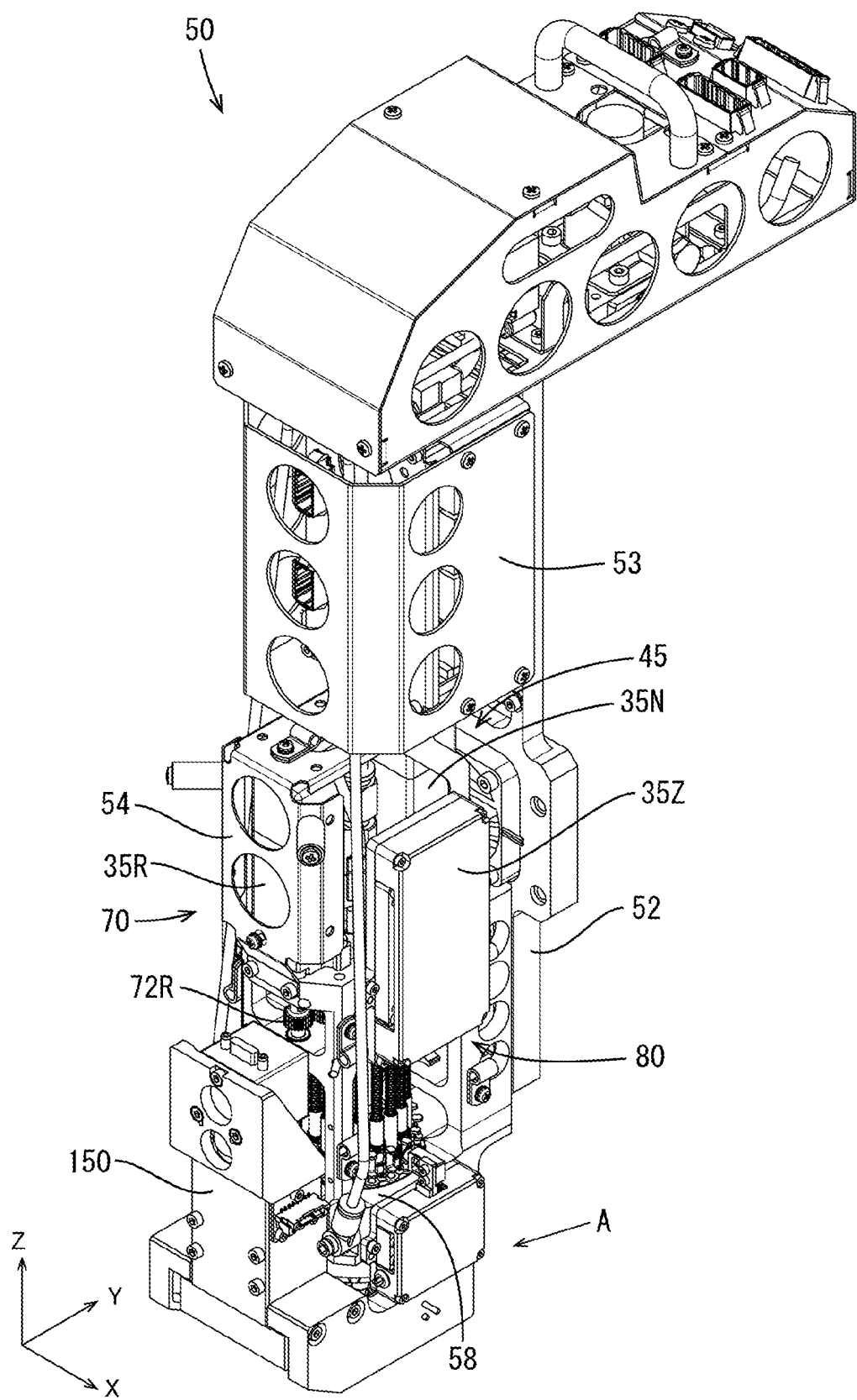
FIG. 2 is a perspective view of a head unit.
Figure 3:
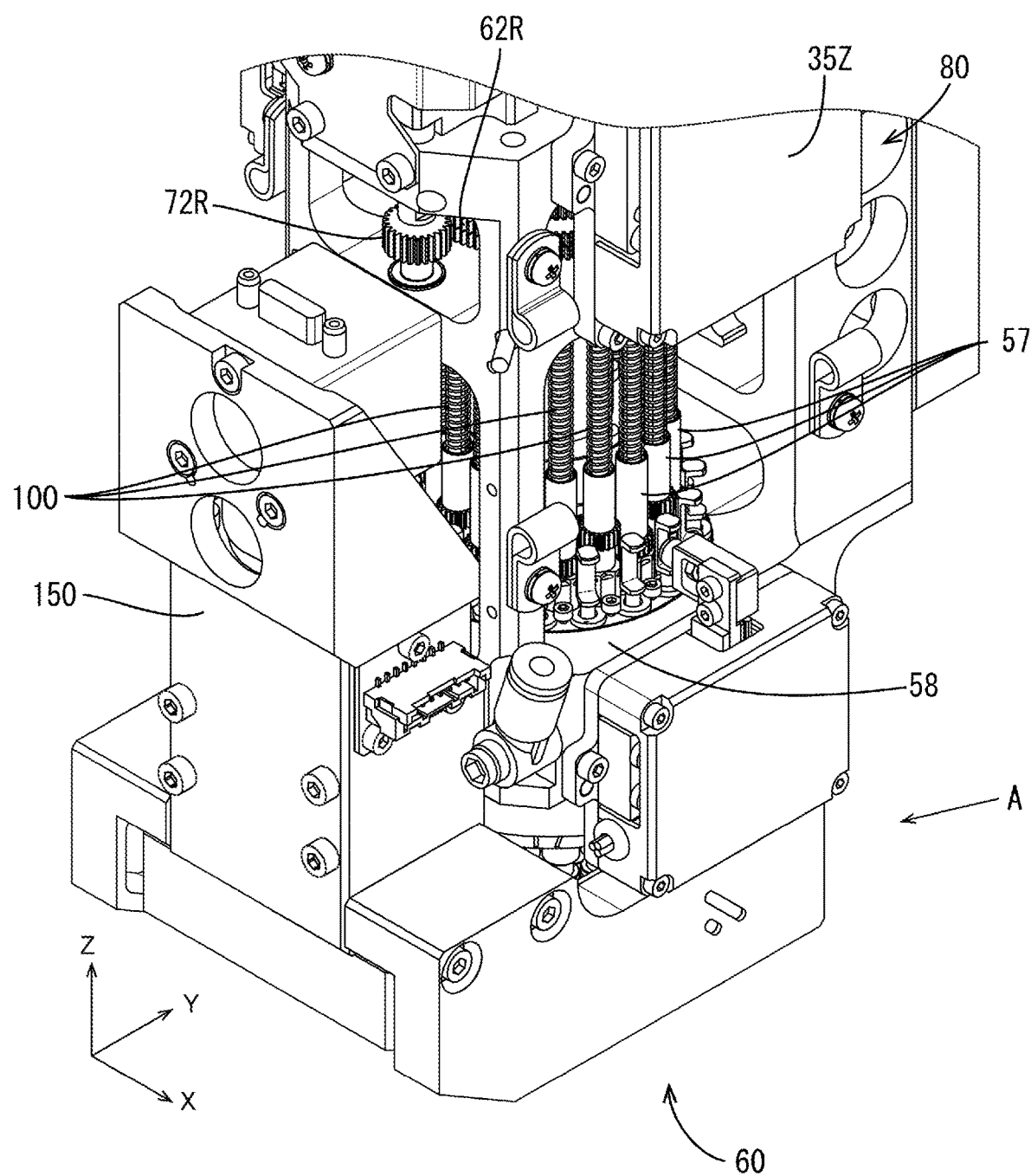
FIG. 3 is a partially-enlarged perspective view of the head unit.
Figure 4:
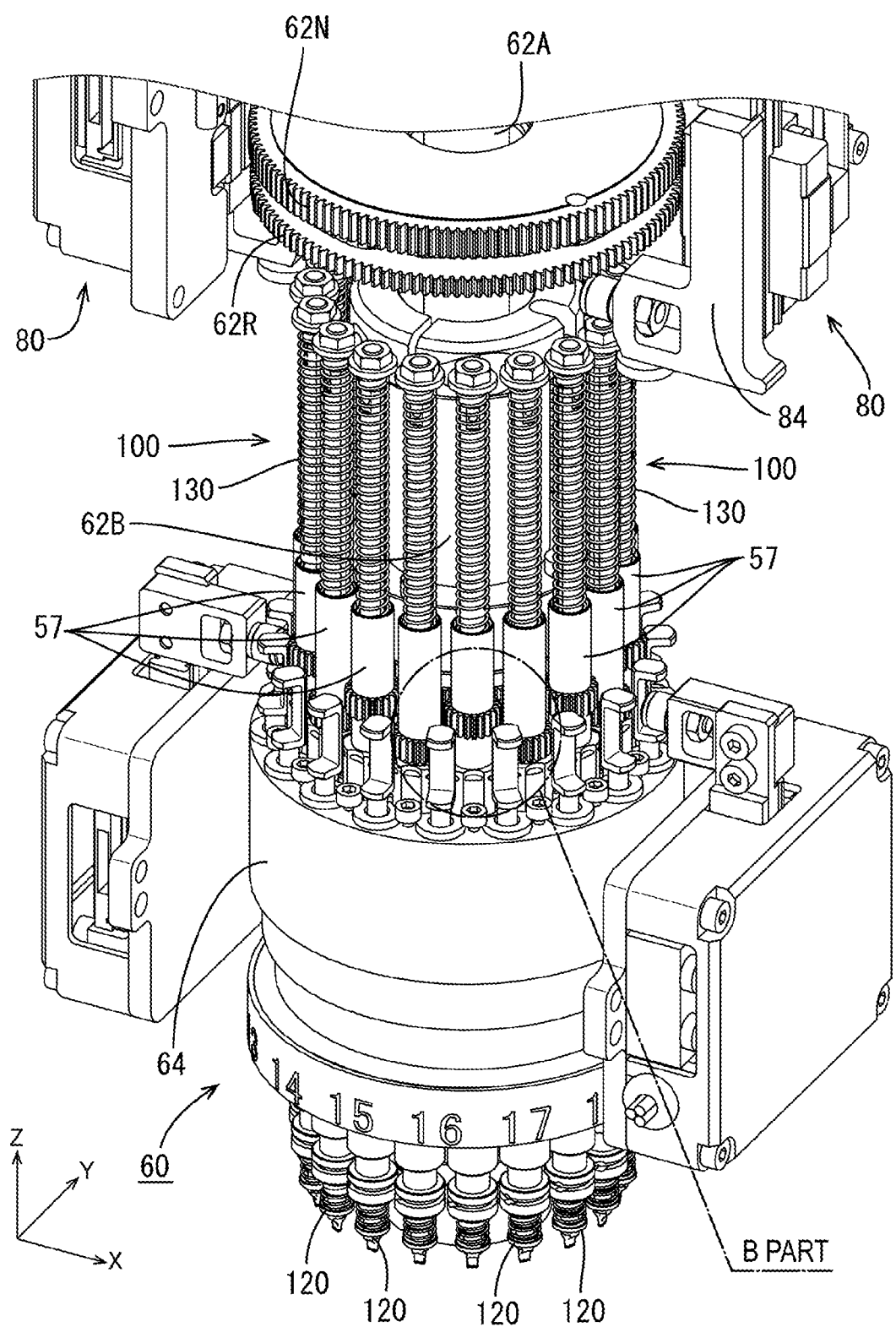
FIG. 4 is a perspective view depicting the structure of a rotator.

The head unit 50 serves a function of suctioning the electronic component E1 supplied by the feeder 42 for mounting on the printed circuit board B1. As depicted in FIG. 2 to FIG. 4, the head unit 50 has a unit main body 60, a base panel 52, an outer ring member 58, and covers 53 and 54. The base panel 52 forms a shape elongated to the vertical direction. The outer ring member 58 has an annular shape, and is fixed to the base panel 52. The base panel 52 and the outer ring member 58 serves a function of supporting the unit main body 60, and corresponds to a "support member" of the present disclosure.

The unit main body 60 is of a rotary type, including a shaft unit 62 forming a shaft shape along the Z-axis direction, a rotator 64, eighteen nozzle shafts 100, and an N-axis driving device 45, as depicted in FIGS. 2 to 4 and FIG. 6.

Figure 6:
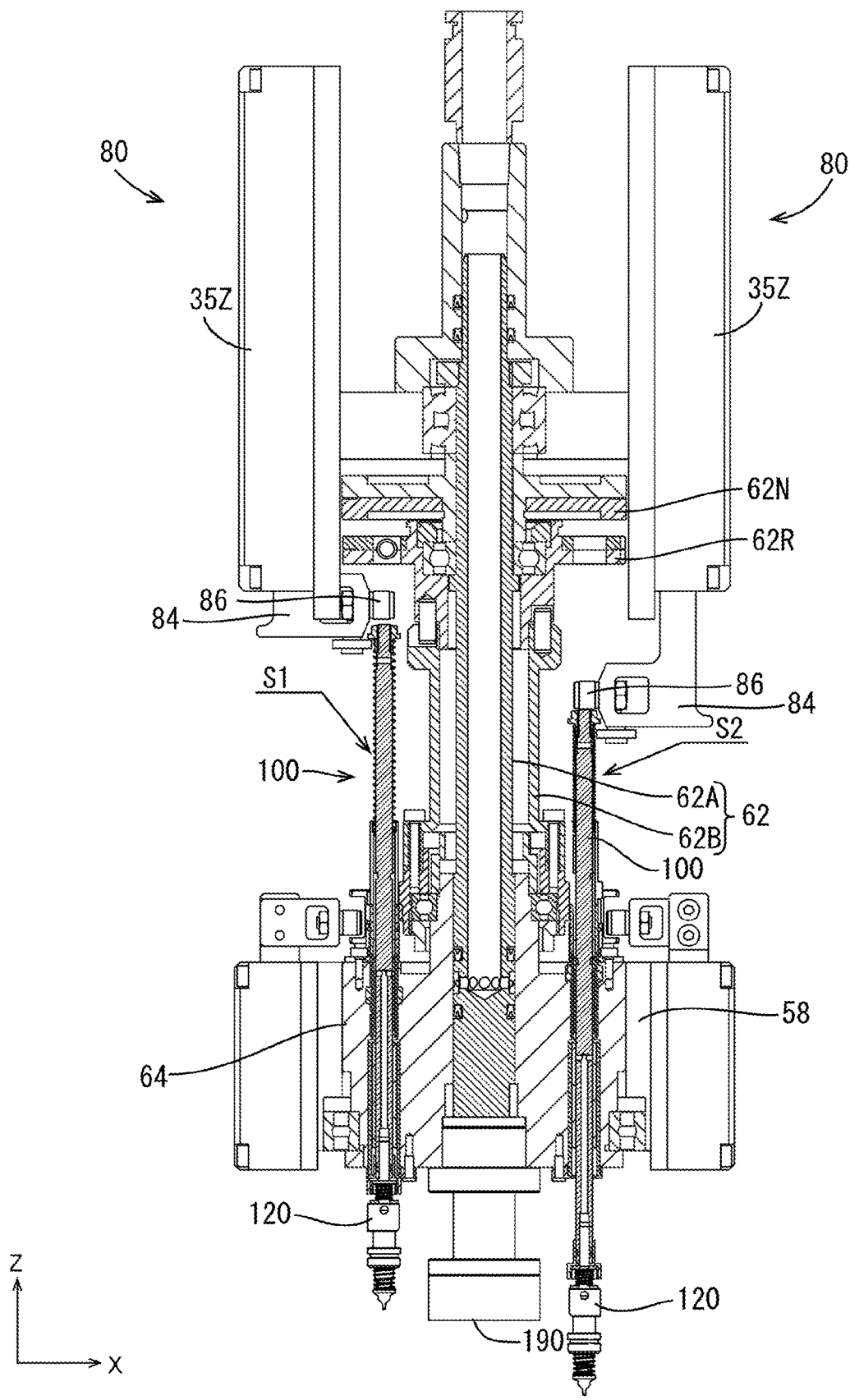
FIG. 6 is a sectional view of main parts of the head unit.

As depicted in FIG. 6, the shaft unit 62 has a double structure, including an outer shaft unit 62B and an inner shaft unit 62A positioned inside the outer shaft unit 62B. The inner shaft unit 62A is rotatably supported about the axis line of the shaft unit 62A with respect to the base panel 52.

The rotator 64 forms a substantially columnar shape having a larger diameter than the shaft unit 62. The rotator 64 is fixed to a lower part of the inner shaft unit 62A. The rotator 64 is positioned on an inner circumferential side of the outer ring member 58, and is supported in a state of being relatively rotated with respect to the outer ring member 58. To depict the rotator 64, the outer ring member 58 is omitted in FIG. 4.

In the rotator 64, eighteen through holes 65 are equidistantly formed in a circumferential direction. To each through hole 65, a nozzle shaft 100, which will be described further below, is attached as penetrating therethrough.

At positions near an upper part of the shaft unit 62, an N-axis driven gear 62N and an R-axis driven gear 62R are vertically arranged (refer to FIG. 4). The N-axis driven gear 62N is coupled to the inner shaft unit 62A, and the R-axis driven gear 62R is coupled to the outer shaft unit 62B.

The N-axis driving device 45 has an N-axis servo motor 35N and an N-axis driving gear (not depicted in the drawing) provided to an output shaft of the N-axis servo motor 35N. The N-axis driving gear is engaged with the N-axis driven gear 62N. Thus, when the N-axis servo motor 35N is driven, the motive power of the motor 35N is transmitted via the N-axis driving gear and the N-axis driven gear 62N to the inner shaft unit 62A. Thus, the structure is such that the rotator 64 rotates together with the inner shaft unit 62A and the eighteen nozzle shafts 100 supported by the rotator 64 rotate integrally with the rotator 64.

The outer shaft unit 62B has both ends in the axial direction bear the inner shaft unit 62A and the rotator 64 via bearings, and can relatively rotate with respect to the inner shaft unit 62A and the rotator 64.

Figure 7:
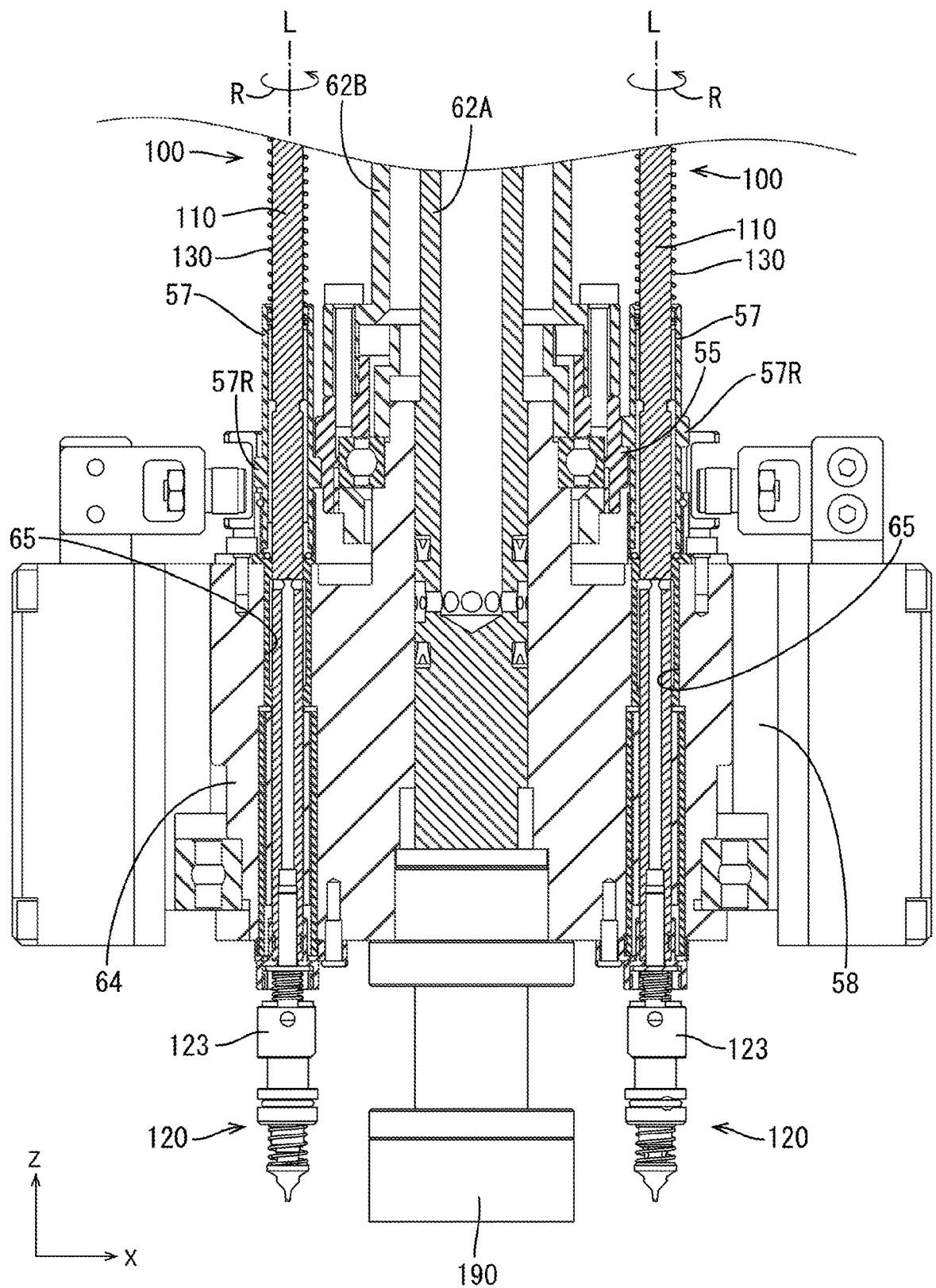
FIG. 7 is a diagram with a part (lower-half) of FIG. 6 enlarged.

The nozzle shafts 100 each include a shaft main body 110 and a suction nozzle 120, as depicted in FIG. 7. The shaft main body 110 has a shaft shape along the Z-axis direction, and is attached to the through hole 65 formed in the rotator 64 via a cylindrical shaft holder 57.

The suction nozzle 120 is removably attached to a lower end of the shaft main body 110 protruding downward from the rotator 64.

To the suction nozzle 120, negative or positive pressure is supplied. Each suction nozzle 120 suctions and holds the electronic component E1 at its tip by negative pressure, and releases the electronic component E1 held at its tip by positive pressure.

To an upper outer peripheral surface of the shaft main body 110, a coil spring 130 is attached. The coil sprint 130 serves a function of pressing the shaft main body 110 upward.

Figure 8:
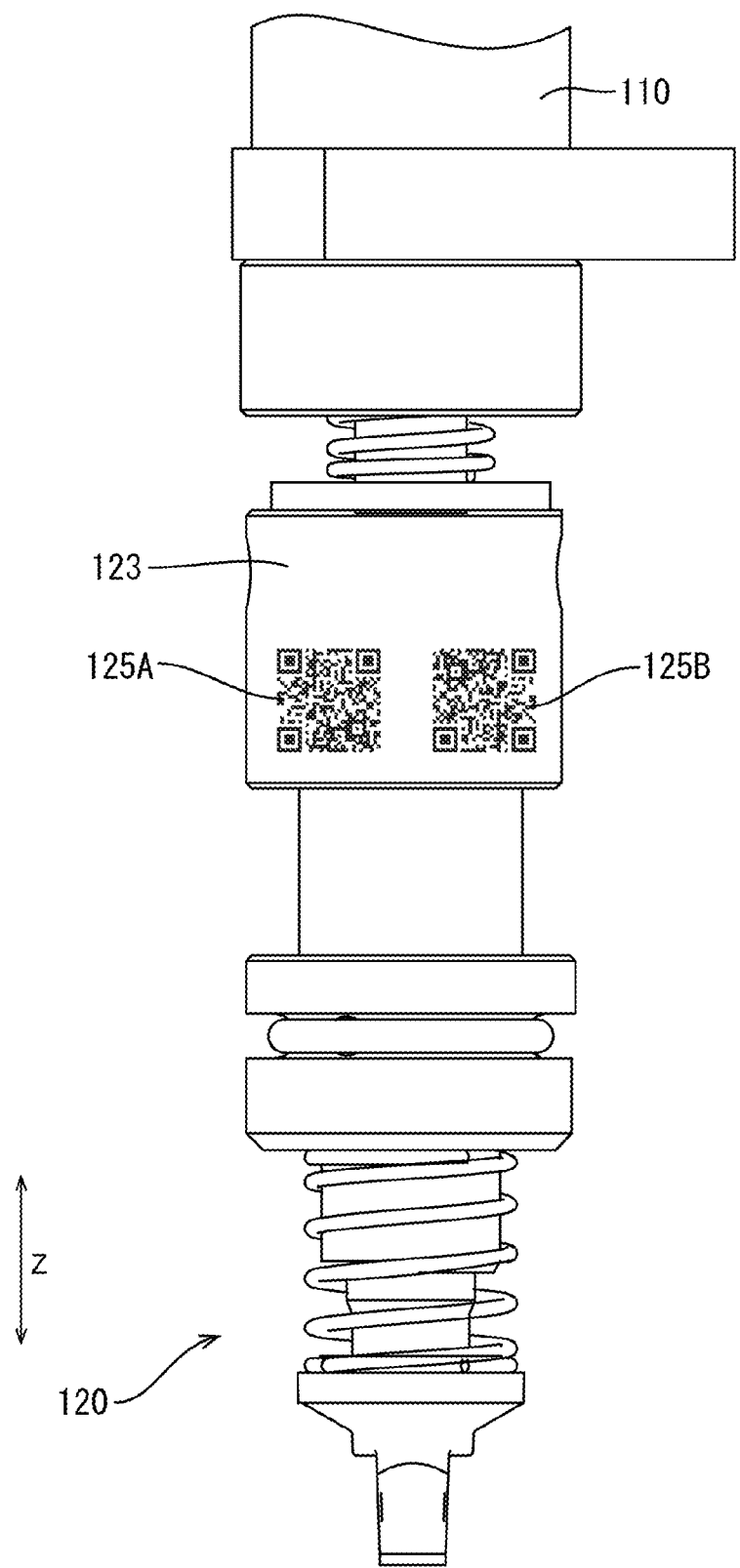
FIG. 8 is an enlarged view of a suction nozzle.

The suction nozzle 120 has a cylindrical coupling unit 123 to be removably coupled to a lower end of the shaft main body 110, as depicted in FIG. 8. On a circumferential side surface of the coupling unit 123, two-dimensional codes 125 (a generic name of 125A and 125B) are provided as identification marks. Specifically, two two-dimensional codes 125A and 125B are printed by laser. These two-dimensional codes 125A and 125B are, for example, QR codes (registered trademarks) or data matrixes, where ID information for identifying the individual suction nozzle 120 and information regarding the type of the suction nozzle 120 are coded and written. The type refers to the size of the nozzle hole and the shape of the nozzle hole.

Next, an R-axis driving device 70 for rotating and driving each nozzle shaft 100 about its axis line L is described.

The R-axis driving device 70 is arranged at a substantially center part in the Z-axis direction of the head unit 50, as depicted in FIG. 2 and FIG. 3, and has an R-axis servo motor 35R, an R-axis driving gear 72R provided to an output shaft of the R-axis servo motor 35R and engaged with the R-axis driven gear 62R, and a common gear 55.

Figure 5:
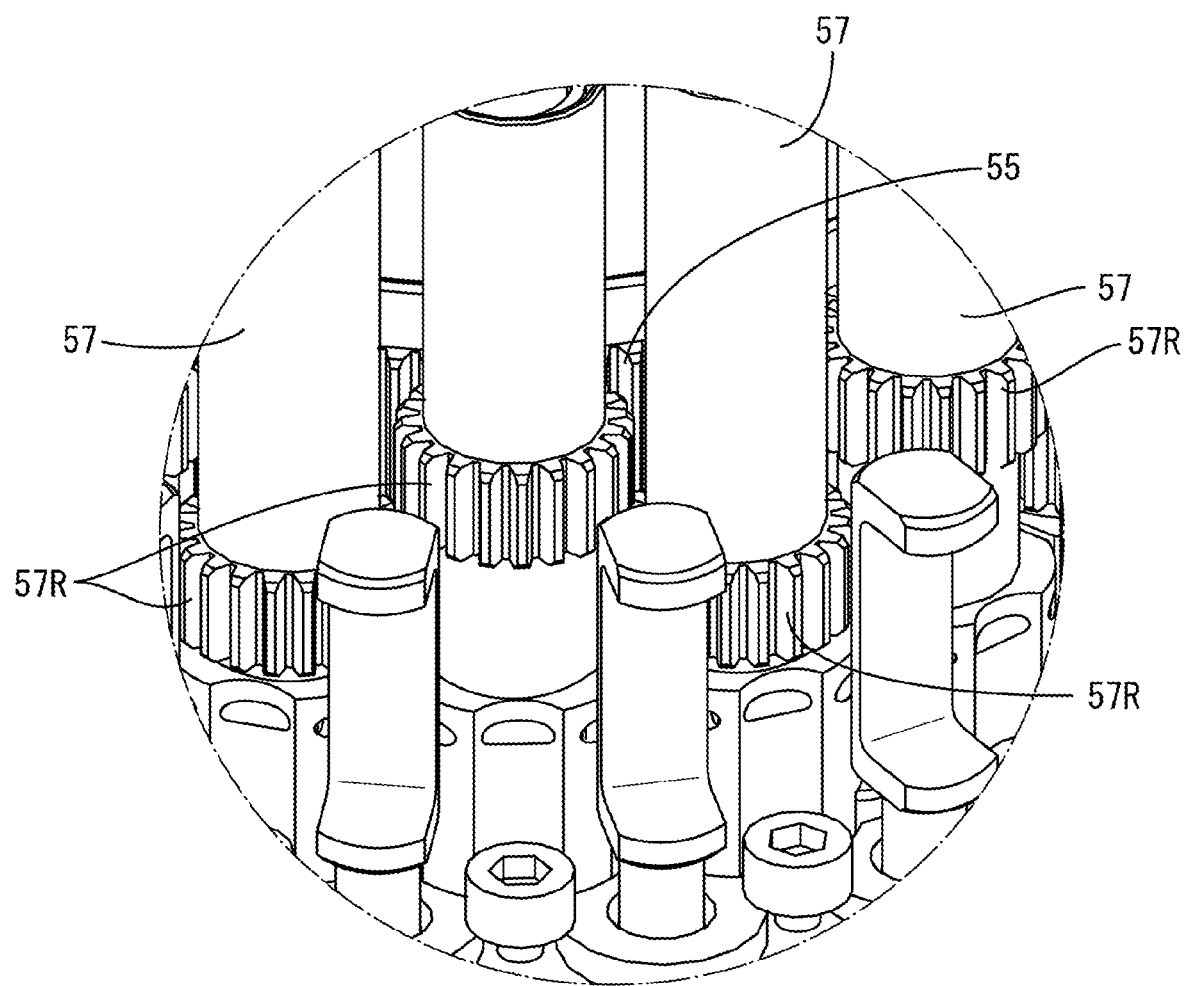
FIG. 5 is a diagram with a B part of FIG. 4 enlarged.

The common gear 55 is provided to a lower part of the outer shaft unit 62B, as depicted in FIG. 5 and FIG. 7. The common gear 55 is engaged with a gear 57R of each shaft holder 57. When the R-axis servo motor 35R is driven, the motive power of the motor 35R is transmitted via the R-axis driving gear 72R and the R-axis driven gear 62R to the outer shaft unit 62B and the common gear 55, thereby rotating the outer shaft unit 62B and the common gear 55.

When the common gear 55 rotates, the engagement with the gear 57R causes each shaft holder 57 to rotate. Since each shaft holder 57 and each shaft main body 110 are coupled through ball spline coupling, with the rotation of the common gear 55, the eighteen nozzle shafts 100 rotate in unison about the axis line L to the same direction at the same angle.

The head unit 50 includes two Z-axis driving devices 80 for causing each nozzle shaft 100 to ascend and descend in the Z-axis direction (vertical direction) with respect to the rotator 64.

The Z-axis driving devices 80 are symmetrically arranged above the nozzle shaft 100 on both left and right sides (both sides in the X-axis direction) of the head unit 50 across the shaft unit 62 of the rotator 64 as depicted in FIG. 6, and cause the nozzle shafts 100 of the eighteen nozzle shafts 100 positioned on both left and right sides (both sides in the X-axis direction) in FIG. 6 to ascend and descend to the Z-axis direction as the vertical direction.

The Z-axis driving device 80 has a Z-axis linear motor 35Z and a Z-axis movable unit 84. The Z-axis linear motor 35Z has a stator (coil) and a mobile unit (magnet) movable to the Z-axis direction. The Z-axis movable unit 84 is fixed to the mobile unit, and moves by the driving of the Z-axis linear motor 35Z to the Z-axis direction (vertical direction).

To a lower end of the Z-axis movable unit 84, a cam follower 86 is attached, as depicted in FIG. 6. When the driving of the Z-axis linear motor 35Z causes the Z-axis movable unit 84 to descend from the initial position depicted in FIG. 6, the cam follower 86 makes contact with an upper end of the shaft main body 110, and the entire nozzle shaft 100 descends against the elastic force of the coil spring 130.

When the Z-axis movable unit 84 is cause to ascend from the state in which the cam follower 86 is in contact with the upper end of the shaft main body 110, the elastic resilient force of the coil spring 130 causes the entire nozzle shaft 100 to move up.

In the state in which the Z-axis movable unit 84 is at an initial position depicted in FIG. 6, the cam follower 86 is positioned above the shaft main body 110 and away from the shaft main body 110. Thus, when the rotator 64 is rotated, each nozzle shaft 110 and the cam follower 86 do not interfere with each other.

With this structure, by activating the X-axis servo motor 35X, the Y-axis servo motor 35Y, the N-axis servo motor 35N, the R-axis servo motor 35R, and the Z-axis linear motor 35Z at predetermined timing, it is possible to perform the process of taking out the electronic component E1 supplied through the feeder 42 by the head unit 50 for attachment on the printed circuit board P.

That is, when the electronic component E1 is taken out from the feeder 42, the X-axis servo motor 35X and the Y-axis servo motor 35Y are driven to move the head unit 50 above the feeder. When the head unit 50 moves above the feeder, the Z-axis linear motor 35Z is driven to cause the first nozzle shaft 100 at an ascent/descent operation position to descend from an ascent end position S1 depicted in FIG. 6. The ascent/descent operation position is a position where an ascent/descent operation by the Z-axis driving device 80 can be performed, and is a left or right position in FIG. 6.

Then, at the timing when the suction nozzle 120 provided at the tip of the nozzle shaft 100 descends to the height of the upper surface of the electronic component E1 supplied by the feeder 42, negative pressure is supplied, thereby allowing the electronic component E1 to be taken out from the feeder 42. Then, after the component is taken out, the Z-axis linear motor 35Z is driven to cause the first nozzle shaft 100 to ascend to the ascent end position S1 depicted in FIG. 6.

Next, the N-axis servo motor 35N is driven to rotate the rotator 64 to cause the second nozzle shaft 100 to move to the ascent/descent operation position. Thereafter, as with the first, the Z-axis linear motor 35Z is driven to cause the second nozzle shaft 100 to descend from the ascent end position S1 depicted in FIG. 6. Then, at the timing when the suction nozzle 120 descends to the height of the upper surface of the electronic component E1 supplied by the feeder 42, negative pressure is supplied, thereby allowing the electronic component E1 to be taken out from the feeder 42 (suction process).

This operation is performed for each of the eighteen nozzle shafts 100, thereby allowing eighteen electronic components E1 to be taken out by one head unit 50 from each feeder 42.

Next, when the taken-out electronic component E1 is mounted on the printed circuit board B1, the X-axis servo motor 35X and the Y-axis servo motor 35Y are driven to move the head unit 50 from above the feeder onto the printed circuit board B1. Also, during the movement of the head unit 50, image-taking of the electronic component E1 by a camera unit 150 is performed (which will be described further below).

Then, when the head unit 50 moves above the printed circuit board, the Z-axis linear motor 35Z is driven to cause the first nozzle shaft 100 at the ascend/descend operation position to descend from the ascent end position S1 depicted in FIG. 6. Also, during a descent, the R-axis servo motor 35R is driven as required to rotate the nozzle shaft 100 about the axis line L to correct the tilt of the electronic component E1.

Then, at the timing when the electronic component E1 held at the suction nozzle 120 descends to the height of the printed circuit board B1, negative pressure is switched to positive pressure, thereby allowing the electronic component E1 to be mounted on the printed circuit board B1. Then, after the electronic component E1 is mounted, the Z-axis linear motor 35Z is driven to cause the first shaft main body 110 to ascend to the ascent end position S1 depicted in FIG. 6.

Next, the N-axis servo motor 35N is driven to rotate the rotator 64 to cause the second nozzle shaft 100 to move to the ascent/decent operation position. Thereafter, as with the first, the Z-axis linear motor 35Z is driven to cause the second nozzle shaft 100 to descend from the ascent end position S1 depicted in FIG. 6. Then, at the timing when the electronic component E1 held at the suction nozzle 120 descends to the height of the printed circuit board B1, negative pressure is switched to positive pressure, thereby allowing the electronic component E1 to be mounted on the printed circuit board B1 (mounting process).

This operation is performed for each of the eighteen shaft main bodies 110, thereby allowing the eighteen electronic components taken out from each feeder 42 to be mounted on the printed circuit board B1.

In the above, the example is described in which only one of the two Z-axis driving devices 80 is used and the electronic components E1 are mounted one by one onto the printed circuit board B1. Other than that, both of the two Z-axis driving devices 80 may be used to cause two shaft main bodies 110 to simultaneously ascend and descend to simultaneously mount two electronic components E1 on the printed circuit board B1. The two Z-axis driving devices 80 can also be alternately used.

Figure 9:
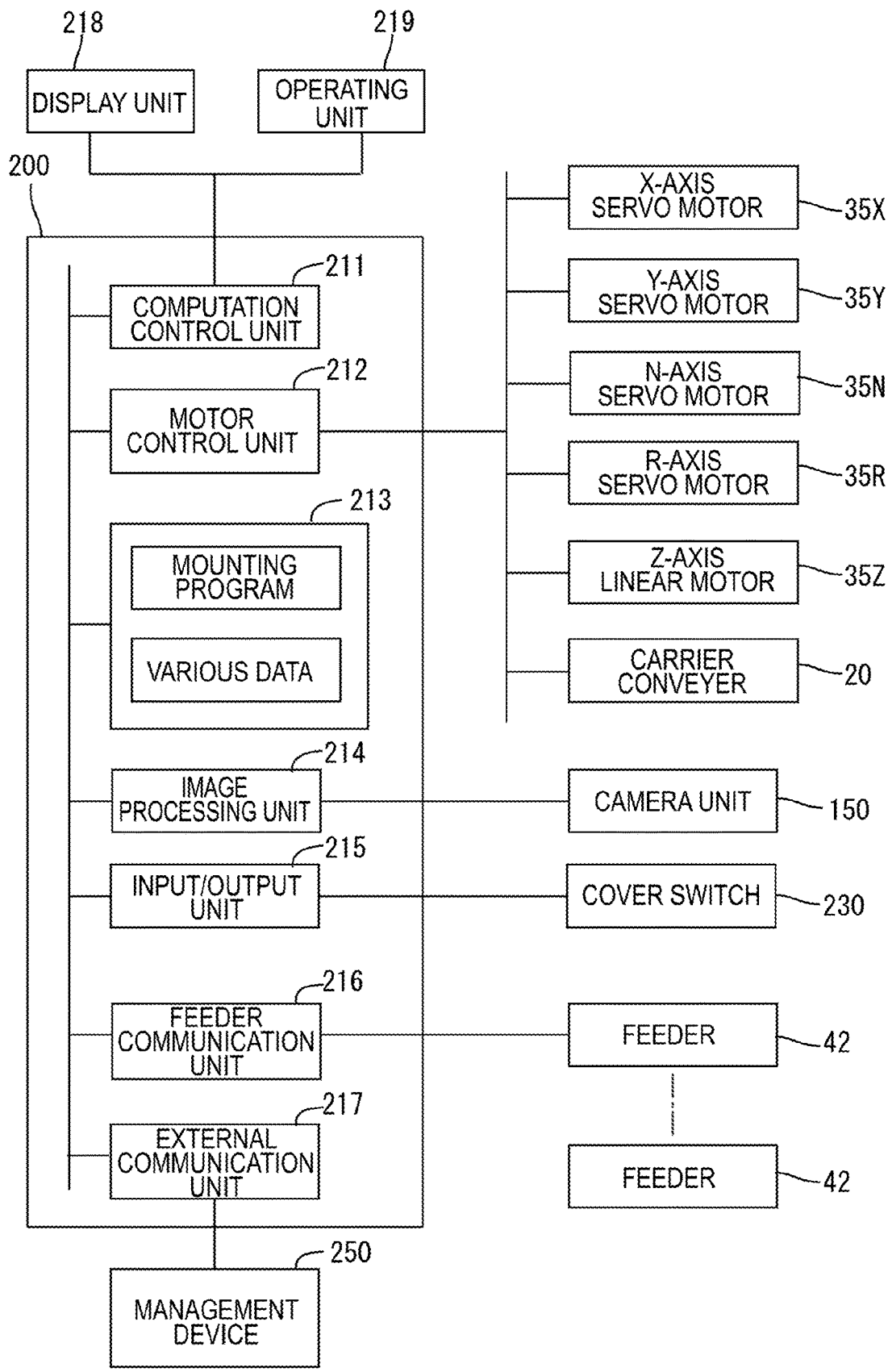
FIG. 9 is a block diagram depicting an electrical structure of the component mounting device.

Next, the electric structure of the component mounting device 1 is described with reference to FIG. 9. The main body of the component mounting device 1 is controlled in its entirety by a controller 200 in a centralized manner. The controller 200 includes a computation control unit 211 configured of a CPU and so forth. Connected to the computation control unit 211 are a motor control unit 212, a storage unit 213, an image processing unit 214, an input/output unit 215, a feeder communication unit 216, an external communication unit 217, a display unit 218, and an operating unit 219.

The motor control unit 212 controls an X-axis servo motor 35X, a Y-axis servo motor 35Y, an N-axis servo motor 35N, an R-axis servo motor 35R, and a Z-axis linear motor 35Z by following an electronic component mounting program. The motor control unit 212 also drives the carrier conveyer 20 by following the mounting program.

The storage unit 213 is configured of a ROM (Read Only Memory), a RAM (Random Access Memory), and so forth. In the storage unit 213, the program for mounting the electronic component E1 and various data required for mounting the electronic component E1 are stored.

In the image processing unit 214, images outputted from the camera unit 150 are each captured and the captured images are analyzed.

To the input/output unit 215, a cover switch 230 is connected. The cover switch 230 is a switch for detecting opening/closing of a safety cover.

The feeder communication unit 216 is connected to each feeder 42 attached to the component supply unit 40, and controls each feeder 42 in a centralized manner.

The external communication unit 217 is connected to a management device 250 which manages a production line for producing the printed circuit board B1, and the controller 200 can communicate with the management device 250 via the external communication unit 217.

The display unit 218 is configured of a liquid crystal display device or the like having a display screen, and causes the state of the component mounting device 1 and so forth to be displayed on the display screen. The operating unit 219 is a keyboard and so forth, and can input various settings, conditions, and so forth to the component mounting device 1.

2. Structure of the Camera Unit

As depicted in FIG. 2, the head unit 50 has the camera unit 150. The camera unit 150 is a sideview camera which takes an image of an image-taking target from a horizontal direction, and is fixed to the outer ring member 58 which rotatably supports the rotator 64.

Figure 10:
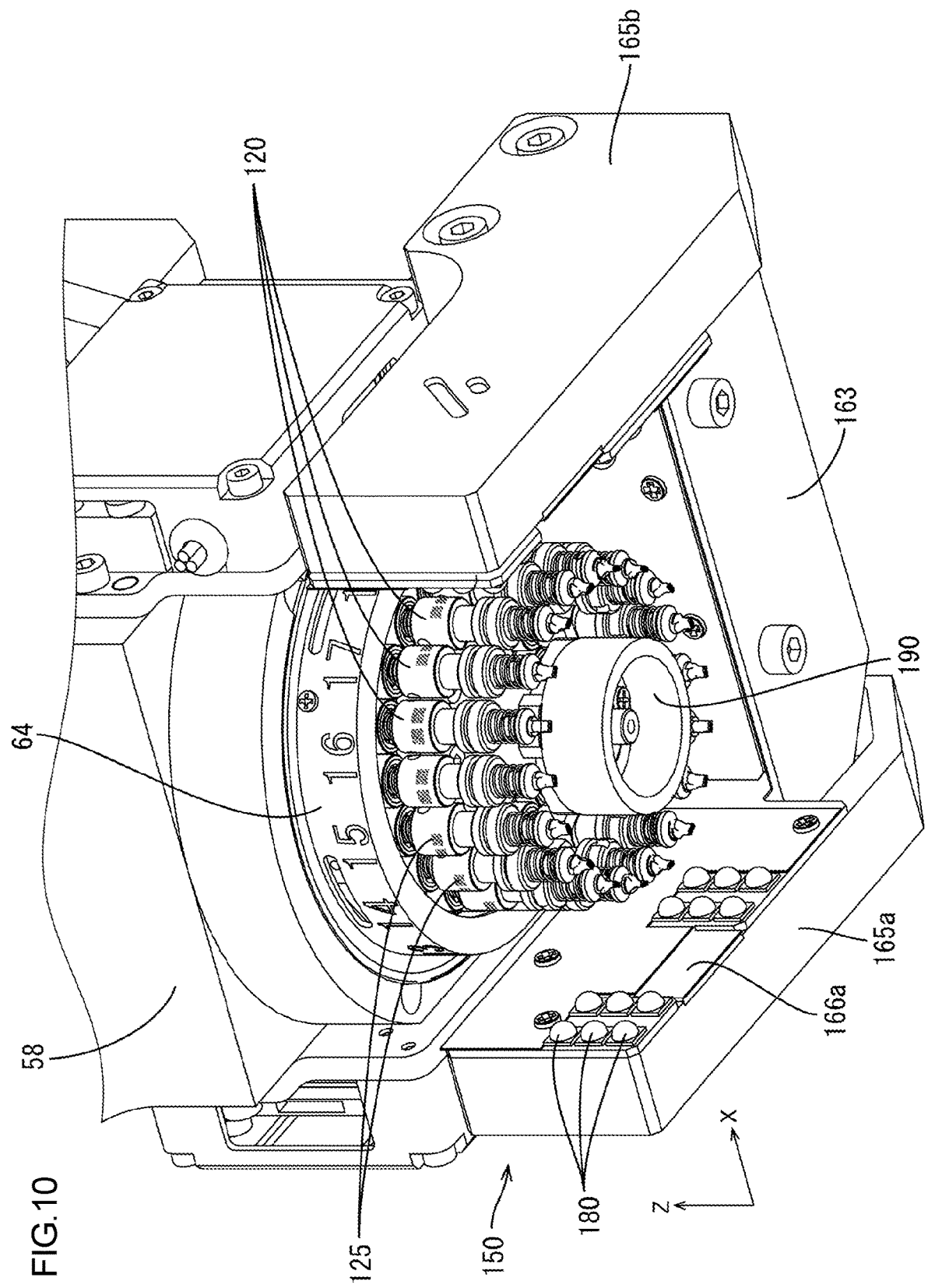
FIG. 10 is a diagram of the head unit viewed from an A direction of FIG. 2.
Figure 11:
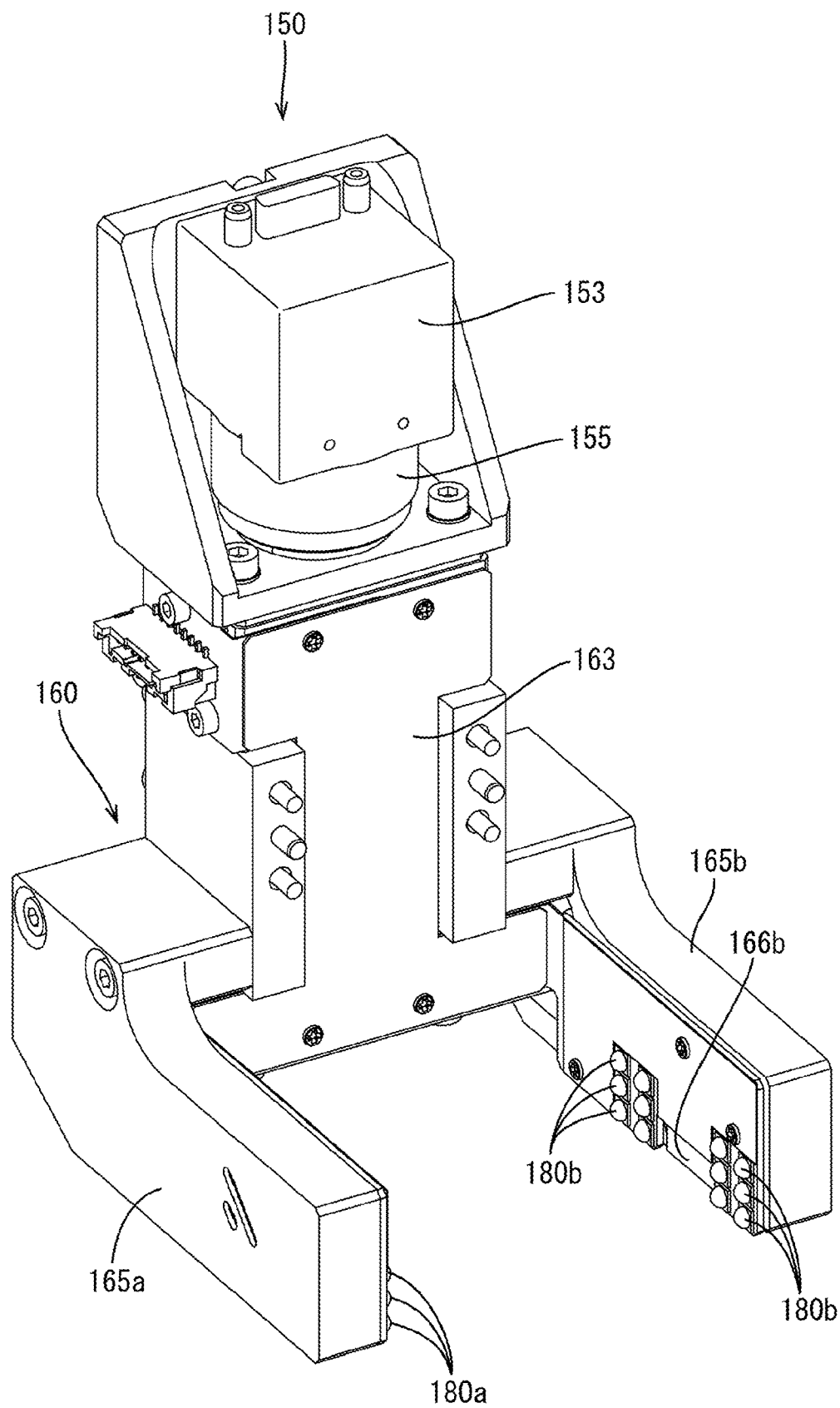
FIG. 11 is a perspective view of a camera unit.
Figure 12:
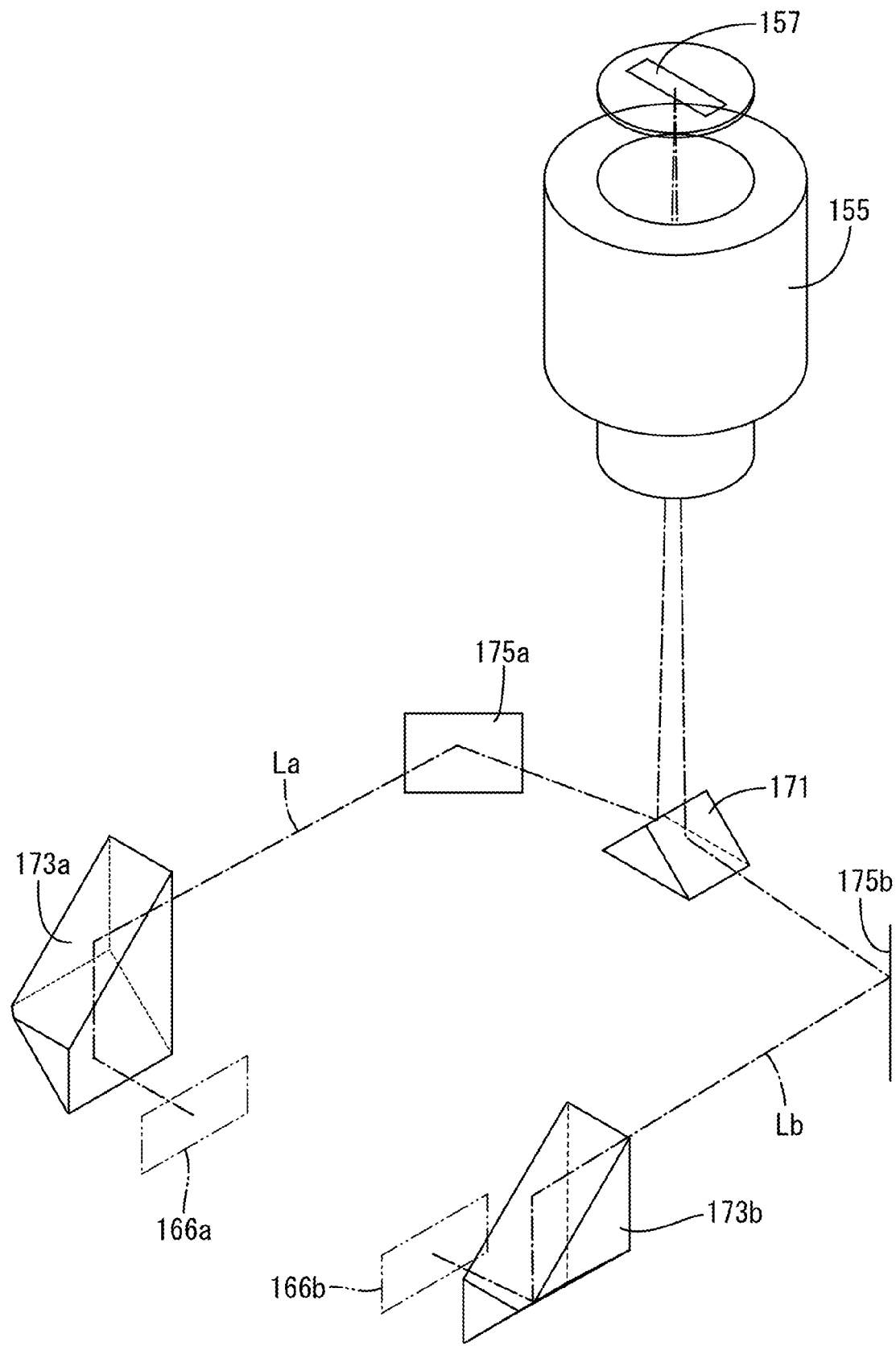
FIG. 12 is an optical path view of the camera unit.

FIG. 10 is a perspective view when FIG. 2 is viewed from an A direction, and FIG. 11 is a perspective view of the camera unit. FIG. 12 is an optical path view of the camera unit.

The camera unit 150 includes a camera main body 153, a light guiding unit 160, and light sources 180a and 180b, as depicted in FIG. 11 and FIG. 12.

The camera main body 153 includes a lens 155 and an imaging unit 157, and is arranged at an upper part (upper part of a center frame) of the light guiding unit 160, with the lens 155 being oriented downward. The light guiding unit 160 guides light to the camera main body 153, and has a center frame 163 and paired side frames 165a and 165b. The center frame 163 is positioned at the rear of the rotator 64 in FIG. 10, and has a triangular center prism 171 arranged therein. The paired side frames 165a and 165b are positioned on both sides of the rotator 64 in the X direction, and the inside is connected to the center frame 163.

Inside the side frame 165a, a first side prism 173a and a second side prism 175a are arranged. Inside the side frame 165b, a first side prism 173b and a second side prism 175b are arranged. On inner surfaces (opposing surfaces to the rotator) of the paired side frames 165a and 165b, incident light windows 166a and 166b are provided, respectively.

The light sources 180a and 180b are arranged on both sides of the incident light windows 166a and 166b in the Y direction. The light sources 180a and 180b are each configured of LEDs of three colors, and selectively emit light of any of red, blue, and green.

The optical path of image-taking light by the camera unit 150 is as depicted in FIG. 12. Image-taking light La incident from the incident light window 166a is reflected sequentially at the first side prism 173a, the second side prism 175a, and a center prism 171 to enter the imaging unit 157 of the camera main body 153.

Also, the structure is such that image-taking light Lb incident from the incident light window 166b is reflected sequentially at the first side prism 173b, the second side prism 175b, and the center prism 171 to enter the imaging unit 157 of the camera main body 153.

As depicted in FIG. 10, a diffusion plate 190 is attached at the center of a lower part of the rotator 64. The diffusion plate 190 has a cylindrical shape, and is positioned inside the circumferentially-arranged suction nozzles 120.

In the present embodiment, by using the above-described camera unit 150, images of both of the electronic component E1 suctioned at each suction nozzle 120 and the two-dimensional codes 125A and 125B provided on the side surface of the suction nozzle 120 can be taken. In the following, a method of taking images of two image-taking targets is described.

(Method of Image-Taking of the Electronic Component E1)

Figure 13:
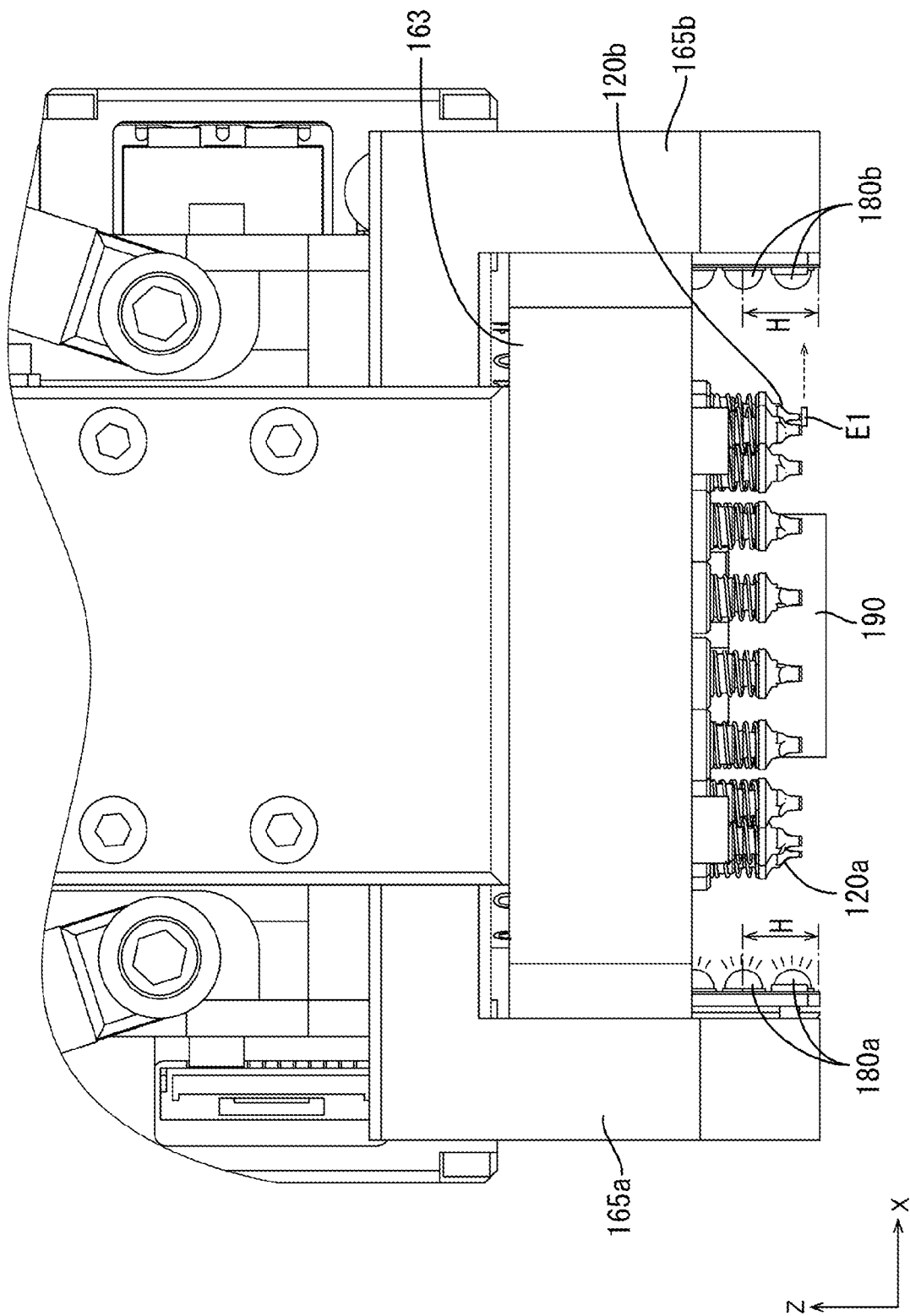
FIG. 13 is a diagram depicting operation of image-taking of an electronic component.

An image of the electronic component E1 is taken by using transmitted lighting. For specific description, for example, when an image of the electronic component E1 held at the suction nozzle 120b positioned at the right end in FIG. 13 is taken, the left light sources 180a depicted in FIG. 13 are lit up.

When the light sources 180a are lit up, that light diffuses at the diffusion plate 190. The diffused light then partially transmits through the electronic component E1 held at the suction nozzle 120b. The light transmitted through the electronic component E1 enters the incident light window 166b of the side frame 165b positioned on the right side in FIG. 13.

The incident light is then reflected at the first side prism 173b, the second side prism 175b, and the center prism 171 to enter the imaging unit 157 of the camera main body 153. Thus, the transmission image of the electronic component E1 can be acquired.

Figure 14:
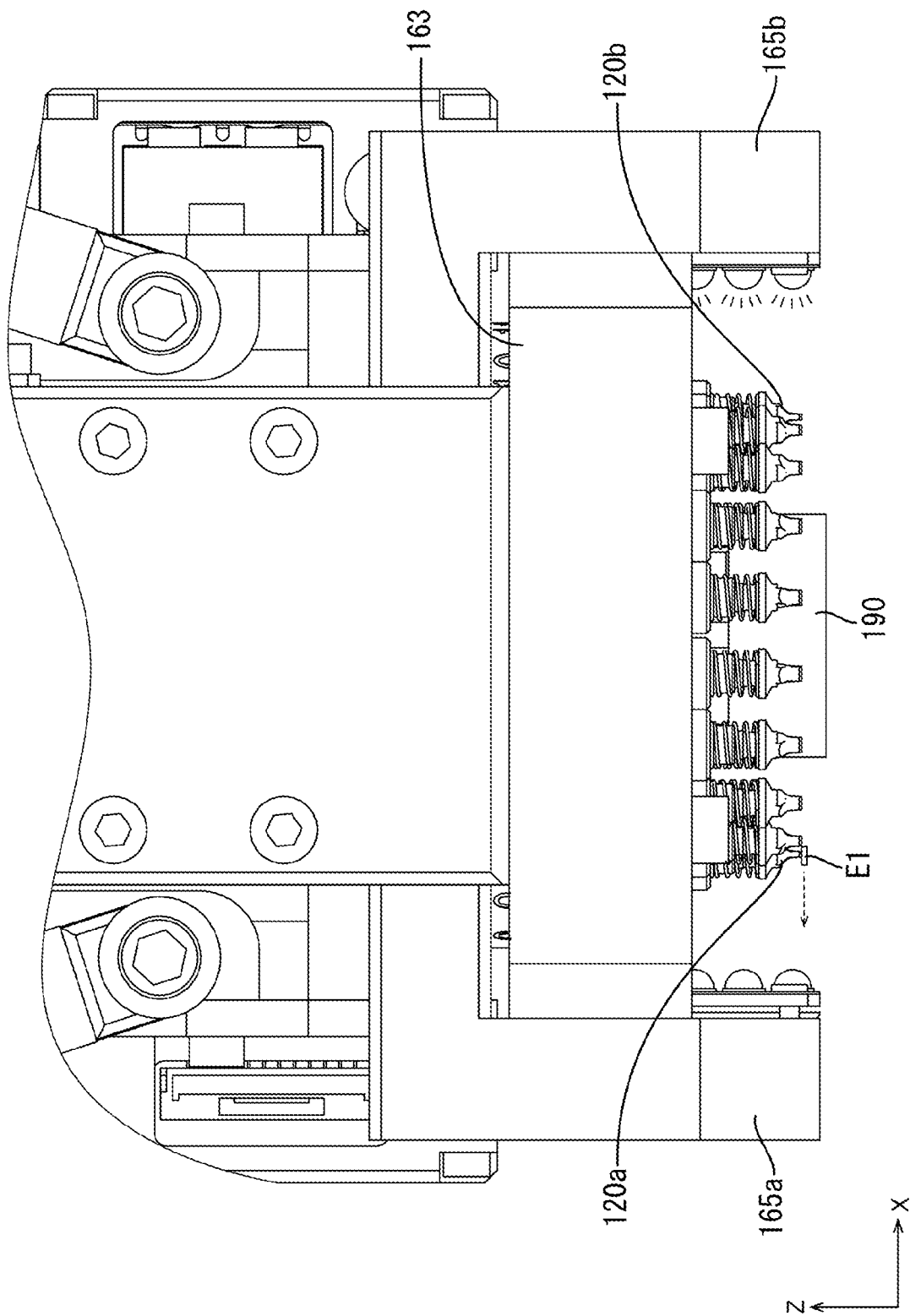
FIG. 14 is a diagram depicting operation of image-taking of the electronic component.

When an image of the electronic component E1 held at the suction nozzle 120a positioned at the left end in FIG. 14 is taken, the right light sources 180b depicted in FIG. 14 are lit up. When the light sources 180b are lit up, light diffused at the diffusion plate 190 partially transmits through the electronic component E1 held at the suction nozzle 120a. The light transmitting through the electronic component E1 enters the incident light window 166a of the side frame 165a positioned on the left side in FIG. 14, and that light is reflected at the first side prism 173a, the second side prism 175a, and the center prism 171 to enter the imaging unit 157 of the camera main body 153. Thus, the transmission image of the electronic component E1 can be acquired.

Also, each of the incident light windows 166a and 166b is provided with a color filter (omitted in the drawing). From this, by selecting a specific color as a light emission color of each of the light sources 180a and 180b, images of the electronic components E1 suctioned and held at the left and right suction nozzles 120 can be simultaneously taken.

Figures 16, 17:
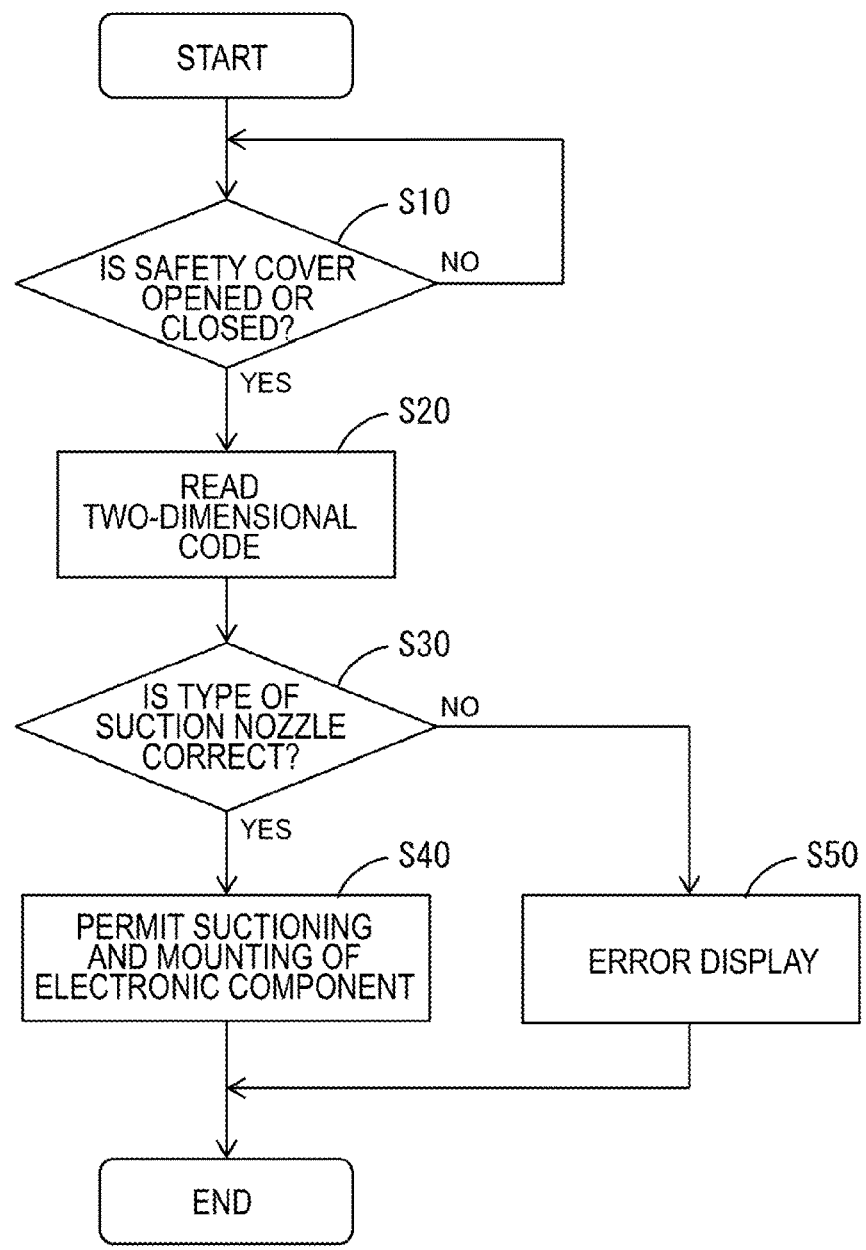
FIG. 16 is a table providing a summary of the position of a shaft main body, lighting, and lit-up pattern for each image-taking target.
FIG. 17 is a flowchart diagram depicting a flow of process of checking a type of the suction nozzle.

For example, when the color filter of the incident light window 166a of the side frame 165a positioned on the left side depicted in FIG. 13 transmits "red color" and the color filter of the incident light window 166b of the side frame 165b positioned on the right side depicted in FIG. 13 transmits "green color", the light sources 180b on the side frame 165b side emit light in "red color", and the light sources 180a on the side frame 165a side emit light in "green color" (refer to FIG. 16).

"H" depicted in FIG. 13 indicates a range of each of the incident light windows 166a and 166b in the Z-axis direction. The position of each of the incident light windows 166a and 166b in the Z-axis direction corresponds to the tip of the suction nozzle 120 when the nozzle shaft 100 is at the ascent end position S1 depicted in FIG. 6. The relation is such that the incident light windows 166a and 166b and the tip of the suction nozzle 120 overlap in the Z-axis direction at the ascent end position S1.

Thus, in the state in which the nozzle shaft 100 is at the ascent end position S1, an image of the electronic component E1 suctioned and held at the suction nozzle 120 can be taken. FIGS. 13 and 14 depict the height of the suction nozzle when the nozzle shaft 100 is at the ascent end position S1.

In this manner, image-taking of the electronic component E1 can be performed in the state in which the nozzle shaft 100 is stopped at the ascent end position S1. For image-taking, it is not required to adjust the position of each nozzle shaft 100 in the Z-axis direction. Thus, by driving the N-axis servo motor 35N to rotate the rotator 64, images of the respective electronic components E1 suctioned and held at the eighteen suction nozzles 120 can be consecutively taken.

In the present embodiment, image-taking of the electronic component E1 by the camera unit 150 is performed during a period in which the head unit 50 is moved from above the feeder to above the printed circuit board, and the suction state of the electronic component E1 with respect to each suction nozzle 120 is detected from the image taken by the camera unit 150.

(Method of Image-Taking of the Two-Dimensional Code)

An image of the two-dimensional code 125 is taken by using reflected lighting. For specific description, when an image of the two-dimensional code 125 of the nozzle shaft 100 is taken, the Z-axis linear motor 35Z is first driven to cause the nozzle shaft 100 to move from the ascent end position S1 to a read position S2 where an image of the two-dimensional code 125 can be taken.

FIG. 6 depicts that the left nozzle shaft 100 is in a state of stopping at the ascent end position S1 and the right nozzle shaft 100 is in a state of stopping at the read position S2. The ascent end position S1 corresponds to a "first position" of the present disclosure, and the read position S2 corresponds to a "second position" of the present disclosure.

Figure 15:
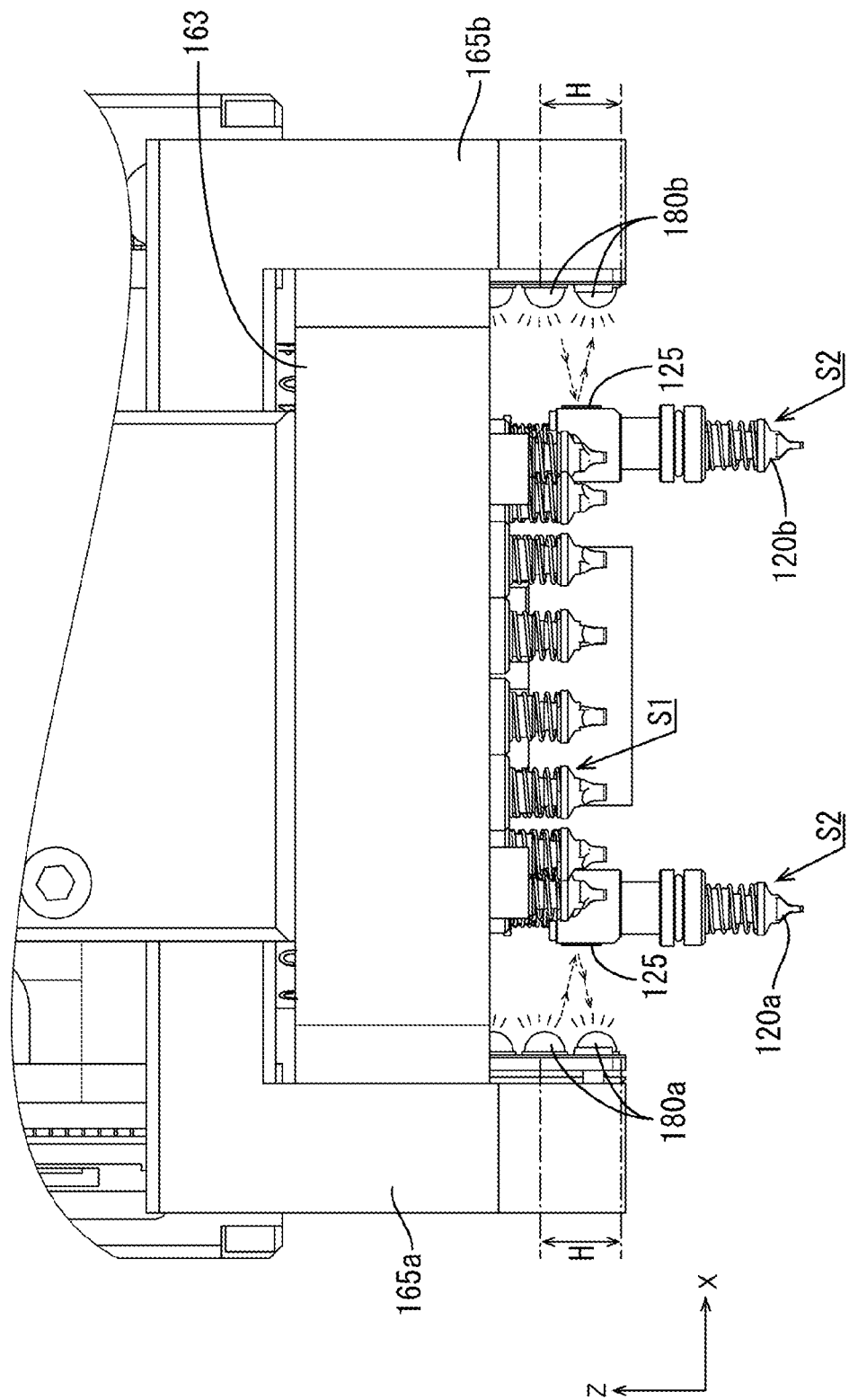
FIG. 15 is a diagram depicting operation of image-taking of a two-dimensional code.

As depicted in FIG. 15, at the read position S2, the relation is such that the two-dimensional code 125 substantially overlaps the range H of the incident light windows 166a and 166b in the Z-axis direction, and the two-dimensional code 125 is positioned at the front of the incident light windows 166a and 166b. For example, when an image of the two-dimensional code 125 of the suction nozzle 120a attached at the tip of the nozzle shaft 100 positioned at the left end in FIG. 15 is taken, the left light sources 180a depicted in FIG. 15 are lit up.

When the light sources 180a are lit up, that light is reflected on the surface of the two-dimensional code 125. The light reflected on the surface of the two-dimensional code 125 then partially enters the incident light window 166a of the side frame 165a positioned on the left side in FIG. 15.

The incident light is reflected at the first side prism 173a, the second side prism 175a, and the center prism 171 to enter the imaging unit 157 of the camera main body 153. Thus, the image of the two-dimensional code 125 of the suction nozzle 120 attached at the tip of the nozzle shaft 100 positioned at the left end in FIG. 15 can be acquired.

When an image of the two-dimensional code 125 of the suction nozzle 120b attached at the tip of the nozzle shaft 100 positioned at the right end in FIG. 15 is taken, the right light sources 180b depicted in FIG. 15 are lit up. When the light sources 180*b* are lit up, that light is reflected on the surface of the two-dimensional code 125. The light reflected on the surface of the two-dimensional code 125 then partially enters the incident light window 166*b* of the side frame 165*b* positioned on the right side in FIG. 15.

The incident light is reflected at the first side prism 173*b*, the second side prism 175*b*, and the center prism 171 to enter the imaging unit 157 of the camera main body 153. Thus, the image of the two-dimensional code 125 of the shaft main body 110 positioned at the right end in FIG. 15 can be acquired.

As depicted in FIG. 8, in the present embodiment, the two-dimensional codes 125*a* and 125*b* are provided to the side surface of the suction nozzle 120 in the circumferential direction. When images of the two two-dimensional codes 125*a* and 125*b* cannot be simultaneously taken all at once, the R-axis servo motor 35R may be driven to adjust the position of the shaft main body 110 in a rotating direction to take an image of each of the two-dimensional codes 125*a* and 125*b* individually by the camera unit 150.

As described above, each of the incident light windows 166*a* and 166*b* is provided with a color filter (omitted in the drawing). From this, by selecting a specific color as a light-emission color of each of the light sources 180*a* and 180*b*, images of the two-dimensional codes 125 of the left and right suction nozzles 120*a* and 120*b* can be simultaneously taken.

For example, when the color filter of the incident light window 166*a* of the side frame 165*a* positioned on the left side depicted in FIG. 15 transmits "red color" and the color filter of the incident light window 166*b* of the side frame 165*b* positioned on the right side depicted in FIG. 15 transmits "green color", the light sources 180*a* on the side frame 165*a* side emit light in "red color" and the light sources 180*b* on the side frame 165*b* side emit light in "green color" (refer to FIG. 16).

As described above, for image-taking of the two-dimensional code 125 by the camera unit 150, it is required to cause the nozzle shaft 100 to descend from the ascent end position S1 to the read position S2 depicted in FIG. 6. Thus, at maximum, the two-dimensional code 125 of each of only two suction nozzles 120 can be read at one image-taking, and it is required to perform image-taking nine times to read the two-dimensional code 125 of all eighteen shaft main bodies 110 mounted on the rotator 64. That is, every time one image-taking is performed, it is required to drive the N-axis servo motor 35N to rotate the rotator 64 by 20 degrees, thereby performing image-taking by moving the next nozzle shaft 100 to the ascent/descent operation position where ascent/descent operation can be performed.

As described above, in the two-dimensional code 125, information about the ID and type of the suction nozzle 120 is written. Thus, in the present embodiment, at the timing when there is a possibility of performing nozzle replacement such as the timing when the safety cover (omitted in the drawing) is opened, the information of the two-dimensional code 125 is read to check the type of the suction nozzle 120.

The safety cover is a cover having a size covering a work area of the head unit 50. During operation of the component mounting device 1 such as during production of the printed circuit board B1, this safety cover is closed to allow the hand of a worker to be prevented from entering the work area of the head unit 50.

The safety cover can be opened when the operation of the component mounting device 1 is stopped. When the safety cover is opened, the work area of the head unit 50 becomes accessible, thereby allowing maintenance of the head unit 50 and so forth. In the present embodiment, the cover switch 230 which detects opening/closing of the safety cover is provided. Based on the output from the cover switch 230, the controller 200 can detect opening/closing of the safety cover.

In the following, a flow of a checking process of checking the type of the suction nozzle 120 is described with reference to FIG. 17. When the process starts, the computation control unit 211 of the controller 200 monitors the output of the cover switch 230 to detect whether the safety cover is opened or closed (S10).

Specifically, since the safety cover is normally closed, it is detected whether the safety cover is opened.

When opening/closing (closing opening) of the safety cover is detected, the computation control unit 211 then performs a process of reading the two-dimensional code 125 of the suction nozzle 120 attached at the tip of each of the eighteen nozzle shafts 100 by the camera unit 150 (S20).

While reading of the two-dimensional code 125 can be performed also immediately after the safety cover is opened, the rotator 64 is required to be rotated, and it is thus preferable to perform the reading process after the safety cover is closed.

When reading of the two-dimensional code 125 is completed, the computation control unit 211 of the controller 200 then identifies the ID and type of the suction nozzle 120 attached at the tip of each nozzle shaft 100 from the read two-dimensional code 125. On the other hand, regarding the eighteen nozzle shafts 100 attached to the rotator 64, the storage unit 213 has stored therein data on the type of each suction nozzle 120 for use in producing a printed circuit board.

The computation control unit 211 then matches the data on the identified type against the data on the correct type of the suction nozzle 120 stored in the storage unit 213 to check whether the type of the suction nozzle 120 attached to each nozzle shaft 100 is not wrong. Checking the type is performed individually for all eighteen nozzle shafts 100.

When the type of the suction nozzle 120 is not wrong for all eighteen nozzle shafts 100, the computation control unit 211 of the controller 200 determines that each type is normal, and permits suctioning and mounting of the electronic component E1 by the head unit 50 on condition that the safety cover is closed (S40).

Thus, subsequently, by using the suction nozzle 120 of the correct type, the process of suctioning and mounting the electronic component E1 is performed. As described above, the process of suctioning and mounting the electronic component E1 is performed by causing the nozzle shaft 100 to descend from an initial position S1. With regard to the relation with the read position S2, in the state of further descending more than the read position S2, the electronic component E1 is taken out from the feeder 42, and the taken-out electronic component E1 is mounted on the printed circuit board B1.

In the process of suctioning and mounting the electronic component E1, correction process is performed based on the ID information of the suction nozzle 120. That is, since the suction nozzles 120 have individual differences, the tip position is varied even among those of the same type. In the present embodiment, for each suction nozzle 120, an error amount of the tip position is measured in advance to calculate a correction value K in the Z-axis direction. Then, the calculated correction value K is stored in the storage unit 213 as being associated with the ID information of the suction nozzle 120 (refer to FIG. 18).

In the process of suctioning and mounting the electronic component E1, the computation control unit 211 of the controller 200 corrects the descending amount of each nozzle shaft 100 (descending amount with reference to the ascent end position S1) based on the correction value K. This allows reduction of an error of the tip position of the suction nozzle 120 in the Z-axis direction when the electronic component E1 is suctioned and mounted, allowing precise process of suctioning and mounting the electronic component E1.

On the other hand, an anomaly is determined when the type of the suction nozzle 120 of even one of all eighteen nozzle shafts 100 is wrong. The computation control unit 211 of the controller 200 causes error display on the display unit 218, and prohibits mounting of the electronic component E1 by the head unit 50 (S50).

This allows reduction of use of the suction nozzle 120 of a wrong type for mounting of the electronic component E1. The check process depicted in FIG. 17 is performed every time the safety cover is opened/closed. Thus, every time the safety cover is opened/closed, the type of the suction nozzle 120 can be checked.

As depicted in FIG. 19, the management device 250 has stored therein, for each suction nozzle 120, the ID information, information about the type of the suction nozzle 120, and information about the previous maintenance time in association with one another.

Thus, by accessing the management device 250, the controller 200 can grasp the previous maintenance time for each suction nozzle 120.

When the maintenance time comes close, the controller 200 causes display for prompting for maintenance of the suction nozzle 120 on the display unit 218. Specifically, to which number of the nozzle shaft 100 the suction nozzle 120 as a maintenance target is attached and by when that suction nozzle 120 is to be subjected to maintenance are displayed.

This allows maintenance of the suction nozzle 120 at optimum timing, and prevents the suction nozzle 120 from being continuously used without maintenance. This allows, for example, reduction of clogging of the suction nozzles 120 to cause a failure of suctioning an electronic component.

3. Description of Effects

In the present structure, the two-dimensional code 125 is provided on the side surface of the suction nozzle 120. Thus, even if the suction nozzle 120 remains attached to the shaft main body 110, the two-dimensional code 125 can be read by using the sideview camera (specifically, the camera unit 150). Thus, compared with the case in which mark recognition cannot be made unless the suction nozzle 120 is removed from the nozzle main body 110, for example, the case in which an identification mark is printed on the upper surface of the flange part of the suction nozzle 120, the process of image-taking and reading of the ID of the suction nozzle 120 can be performed in a short time.

In the present structure, the camera unit 150 is mounted on the head unit 50. Thus, even during movement of the head unit 50, an image of the two-dimensional code 125 can be taken. Also, by adjusting the position of the nozzle shaft 100 in the Z-axis direction, the camera unit 150 can take images of both of the electronic component E1 and the two-dimensional code 125. Thus, compared with the structure in which images are taken by separate cameras, the number of cameras can be reduced.

The head unit 50 is a so-called rotary-type head, and the camera unit 150 is fixed to the outer ring member 58 which rotatably supports the rotator 64. In this structure, the rotation of the rotator 64 can adjust the position of each nozzle shaft 100 in the circumferential direction with respect to the camera unit 150. Thus, it is not required to move the camera unit 150 side to take an image of the two-dimensional code 125 of each suction nozzle 120.

Second Embodiment

Figure 20:
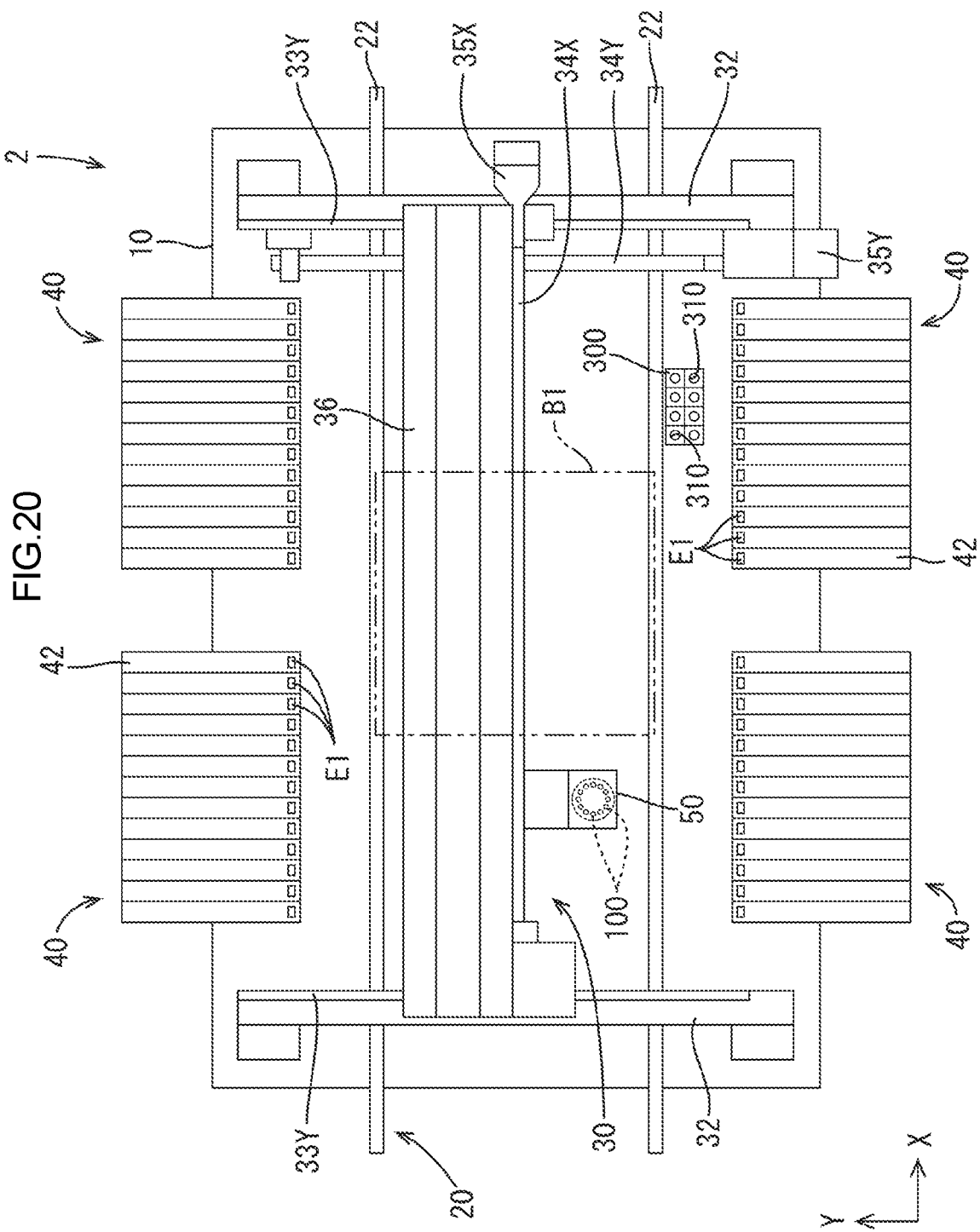
FIG. 20 is a plan view of a component mounting device applied to a second embodiment.

In a component attachment device 2 of a second embodiment, a nozzle replacing device 300 is added to the component mounting device 1 of the first embodiment. For specific description, the nozzle replacing device 300 is arranged on the base 10 of the component mounting device 2, as depicted in FIG. 20. The nozzle replacing device 300 is positioned in a movable area of the head unit 50, and includes a main body having a plurality of accommodation units 310 and a shutter (omitted in the drawing). In each accommodation unit 310, a new suction nozzle 120 is accommodated. At the time of nozzle replacement, the head unit 50 is first moved above the nozzle replacing device 300, and the nozzle shaft 100 having attached thereto the suction nozzle 120 to be removed is positioned above a vacant accommodation unit 310. Then, the nozzle shaft 100 is caused to descend to a predetermined height from the initial position S1. With this, approximately a half of the lower side of the suction nozzle 120 is in a state of being accommodated in the accommodation unit 310. Thereafter, after the shutter is activated to lock so that the suction nozzle 120 is prevented from falling down from the accommodation unit 310, the moving-down nozzle shaft 100 is moved up, thereby allowing the suction nozzle 120 to be removed from the shaft main body 110 of the nozzle shaft 100.

On the other hand, when a new suction nozzle 120 is attached, the head unit 50 is first moved above the nozzle replacing device 300, and the shaft main body 110 of the nozzle shaft 100 is positioned above the accommodation unit 31 which accommodates the suction nozzle 120 as a mount target. Then, the shaft main body 110 is caused to descend from the initial position S1. When it is caused to descend to a height depicted in FIG. 21, the tip of the shaft fits in the suction nozzle 120 accommodated in the accommodation unit 310, and the suction nozzle 120 is fixed to the tip of the shaft main body 110. Then, with the nozzle shaft 100 moved up, the suction nozzle 120 can be taken out from the accommodation unit 310.

Figure 21:
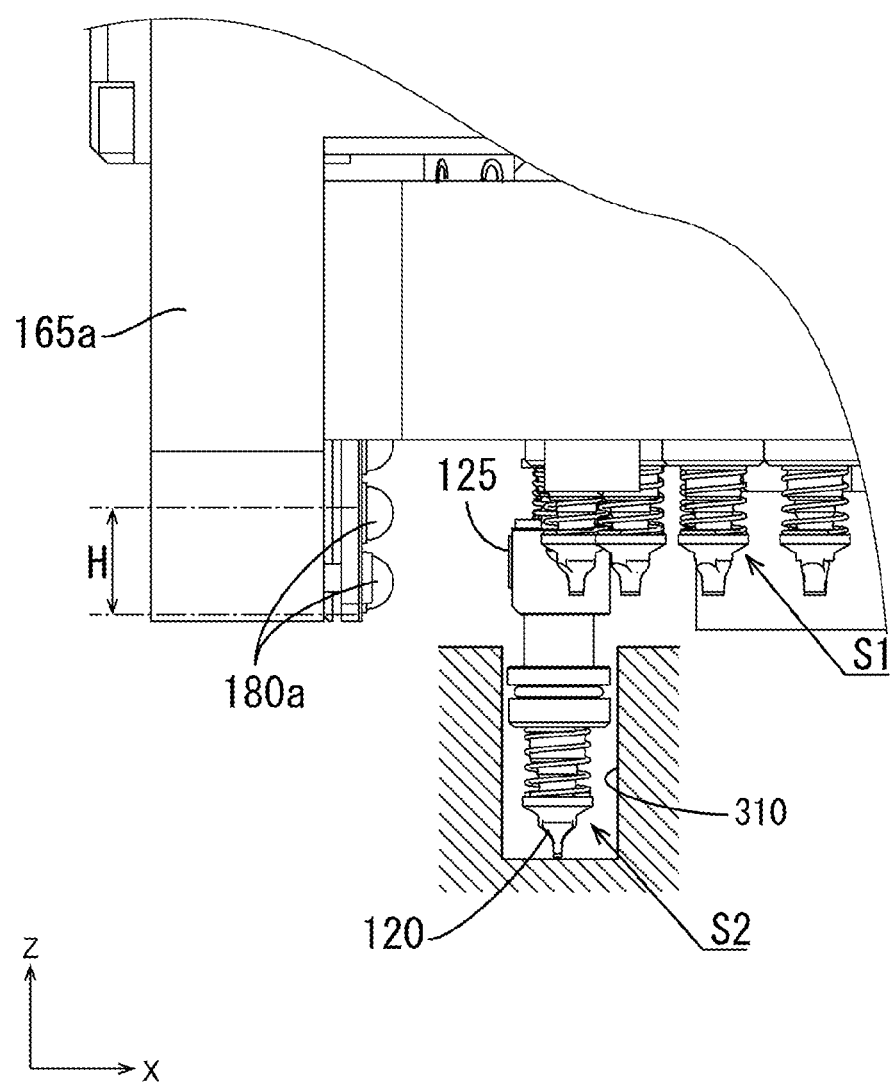
FIG. 21 is a diagram depicting operation of image-taking of a two-dimensional code.

As depicted in FIG. 21, the two-dimensional code 125 is positioned on the front surface of the camera unit 150 (specifically, the front surface of the light-receiving window 166a of the side frame 165a) in the state in which the suction nozzle 120 is accommodated in the accommodation unit 310. Thus, from the state in which the shaft main body 110 fits in the suction nozzle 120, the lightings 180a are lit up, thereby allowing image-taking of the two-dimensional code 125 of the suction nozzle 120 newly attached to the shaft main body 110.

In this manner, in the second embodiment, the relation is such that the shaft main body 110 fits in the suction nozzle 120 accommodated in the accommodation unit 310 at the read position S2. Thus, image-taking of the two-dimensional code 125 can be performed at the position where the shaft main body 110 fits in the suction nozzle 120 to be replaced, and an image of the two-dimensional code 125 of the suction nozzle 120 can be taken at the time of nozzle replacement. From the above, image-taking of the two-dimensional code 125 of every suction nozzle 120 can be performed for every replacement. At the time of completion of replacement, the types and IDs of all suction nozzles 120 replaced can be acquired. That is, the two-dimensional code 125 can be known immediately after nozzle replacement, and the type and ID of the suction nozzle 120 can be known before the suction nozzle 120 after replacement is used. Since image-taking is performed during operation of causing the suction nozzle 120 to ascend and descend for nozzle replacement, there is an advantages that image-taking of the two-dimensional code 125 is not required to be again performed alone, aside from nozzle replacement.

However, after the safety cover is opened, as described in the first embodiment, it is preferable to take an image of the two-dimensional code 125 of the suction nozzle 120 to acquire the type and ID of the suction nozzle 120. Other than that, an image of the two-dimensional code 125 may be taken when the suction nozzle 120 is caused to descend from the initial position S1 in order to suction the first electronic component E1 after the safety cover is opened and then closed. This allows data on the acquired ID and type to be utilized for component attachment. Image-taking of the two-dimensional code 125 may be always performed not only when the first component is suctioned after the safety cover is opened or closed but also when the suction nozzle 120 is caused to ascend or descend to suction or attach the electronic component E1.

In the above-description, as depicted in FIG. 21, the example has been described in which an image of the two-dimensional code 125 is taken by the camera unit 150 at the position where the shaft main body 110 fits in the suction nozzle 120 to be replaced. Other than this, with the two-dimensional code 125 of the suction nozzle 120 set to be positioned at the front of the camera unit 150 (specifically, at the front of the light-receiving windows 166a and 116b) when the shaft main body 110 fits in the suction nozzle 120 and is then caused to ascend to some degree, an image of the two-dimensional code 125 may be taken by the camera unit 150 during moving-up after fitting.

Other Embodiment

The technology disclosed in the specification is not limited by the embodiments described above and based on the drawings and, for example, the following embodiments are included in the technological scope.

(1) While the rotary-type head unit 50 has been exemplarily described in the above-described embodiments, an inline-type head unit with a plurality of nozzle shafts 100 linearly arranged may be used.

(2) In the above-described embodiments, the example is described in which an image of the two-dimensional code 125 of the suction nozzle 120 is taken by the camera unit 150 mounted on the head unit 50. The two-dimensional code 125 of the suction nozzle 120 may be any which is read by a sideview camera. For example, the sideview camera may be fixed to a strut provided on the base 10 and an image of the two-dimensional code 125 may be taken by that camera. The sideview camera is a camera which has a field of view from a viewpoint to a horizontal direction and takes an image of a side surface of a target.

(3) In the above-described embodiments, the two-dimensional code 125 has been exemplarily described as an identification mark of the suction nozzle 120. The identification mark is not necessarily limited to the two-dimensional code 125, and may be a character, graphic, or the like. Any identification mark that can identify either of an individual and a type of the suction nozzle 120 may be used.

(4) In the above-described embodiments, the example has been described in which two two-dimensional codes 125a and 125b are printed on the side surface of the suction nozzle 120 so as to be aligned in the circumferential direction. The number of two-dimensional codes 125 is not limited to two, and may be three or more. The number may also be one.

Figure 22:
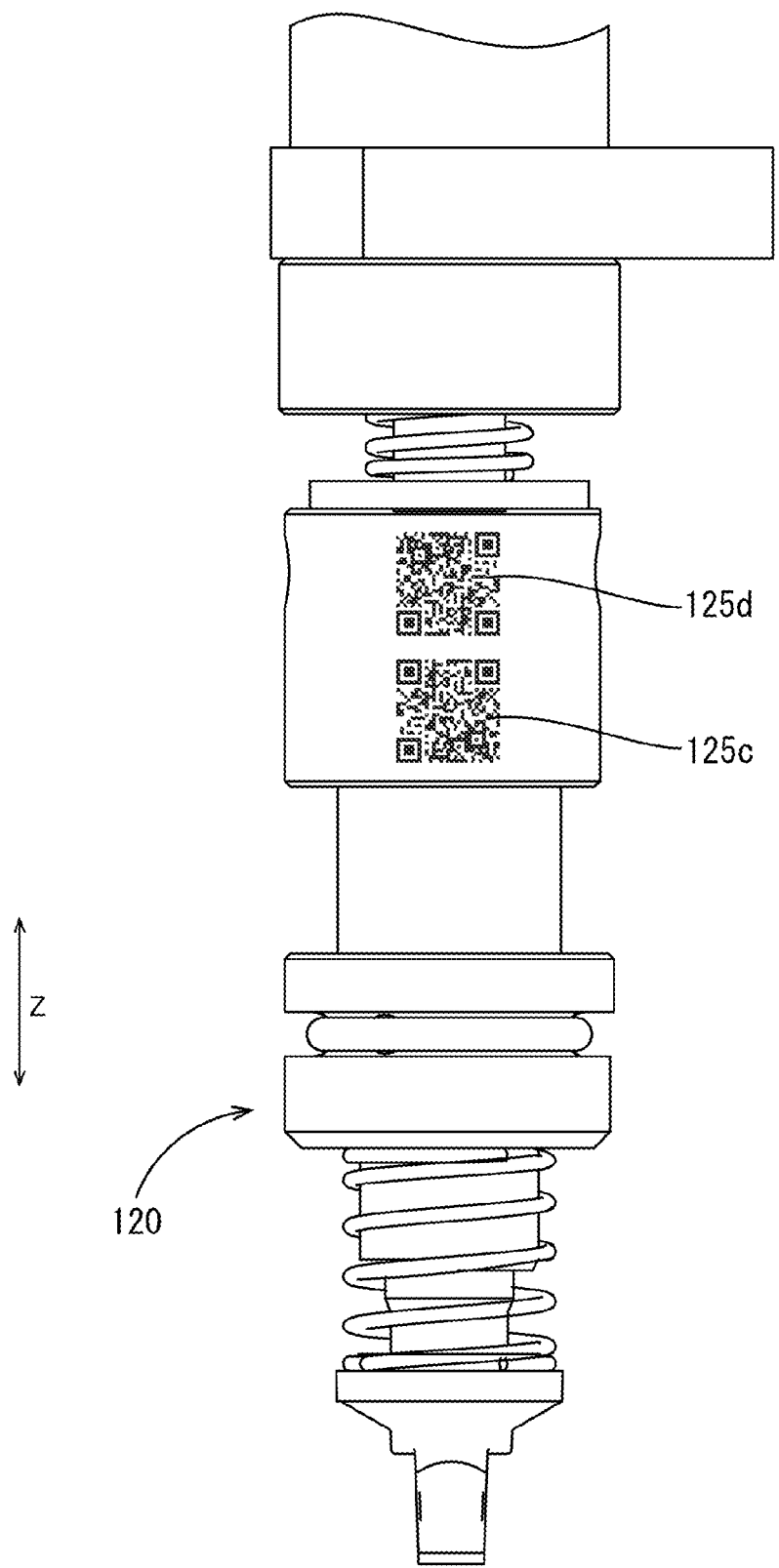
FIG. 22 is a diagram depicting another mode of the suction nozzle.

(5) In the above-described embodiments, the example has been described in which two two-dimensional codes 125a and 125b are printed on the side surface of the suction nozzle 120 so as to be aligned in the circumferential direction. The alignment of the two-dimensional codes 125 is not limited to the circumferential direction. For example, as depicted in FIG. 22, the structure may be such that two-dimensional codes 125c and 125d are printed so as to be aligned in the Z-axis direction.

When the two two-dimensional codes 125c and 125d are printed so as to be aligned in the Z-axis direction, the position of the nozzle shaft 100 in the Z-axis direction may be adjusted for each of the two-dimensional codes 125c and 125d for image-taking.

(6) In the above-described embodiments, when opening/closing of the safety cover is detected, the two-dimensional code 125 is read to check the type of the suction nozzle. For example, the two-dimensional code 125 may be read to check the type of the suction nozzle when the component mounting device 1 makes an emergency stop.

(7) In the above-described embodiments, the example has been described in which the individual of the suction nozzle 120 is identified and the descending amount of the nozzle shaft 100 is corrected in accordance with variations of the tip position of each individual. Other than this, the individual of the suction nozzle 120 may be identified and the mounting position of the electronic component may be corrected in accordance with variations of eccentricity of the nozzle hole of each individual.

Figure 23:
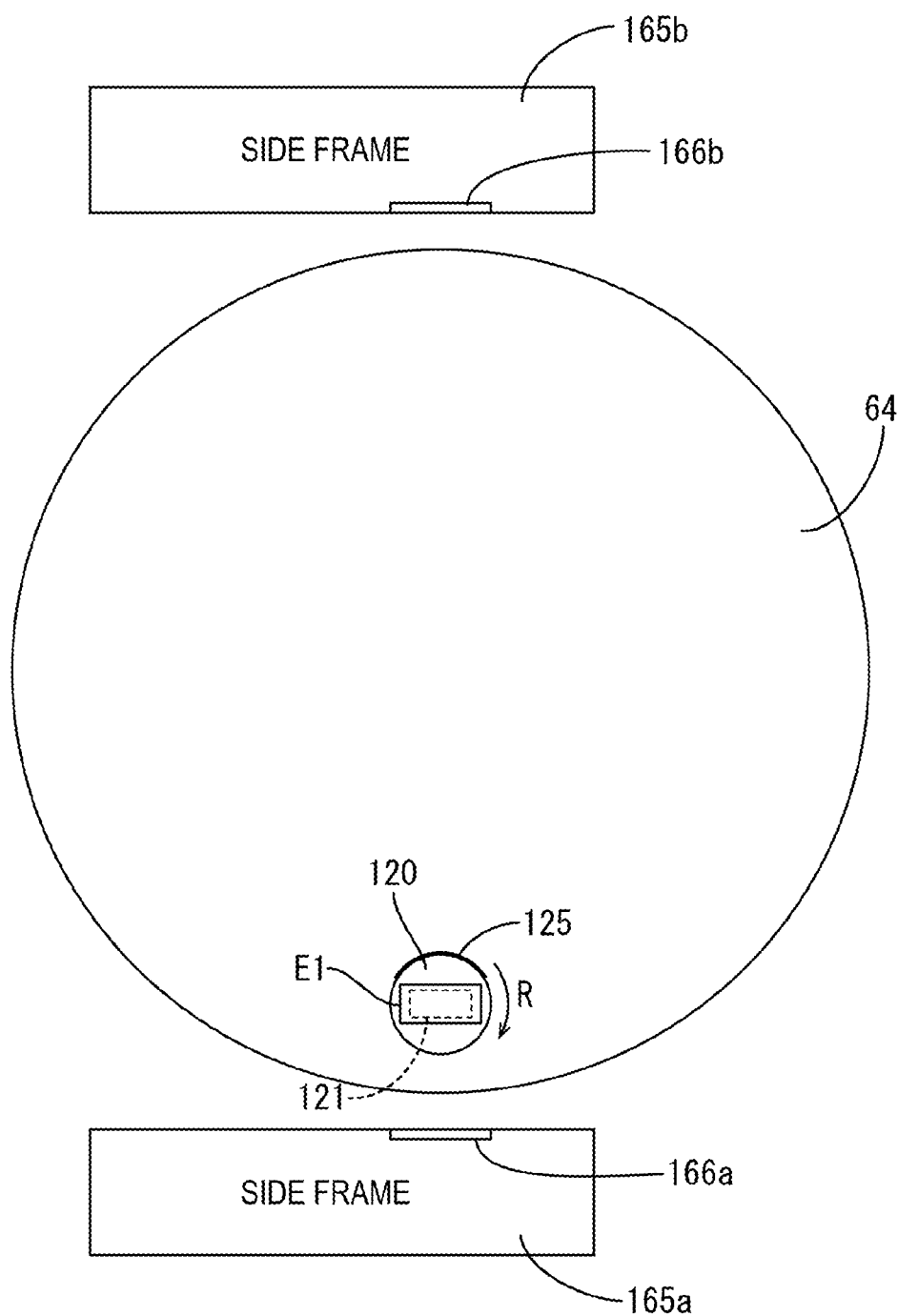
FIG. 23 is a diagram depicting a positional relation between a two-dimensional code and a camera unit.

The shape of a tip part 121 of the suction nozzle 120 is generally a rectangle so as to match the shape of the component. When the normal component (rectangular electronic component) E1 is suctioned, as depicted in FIG. 23, the suction angle position of the suction nozzle 120 is defined so as to match the orientation of the component. In the above-described embodiments, the example has been described in which the two-dimensional code 125 is arranged at a position shifted upward from the tip of the suction nozzle 120. When the normal component is suctioned by the suction nozzle 120, the two-dimensional code 125 may be arranged at a rotation position where an image thereof cannot be taken by the camera unit 150 (position in the circumferential direction by taking the axis line L as a center). For example, as depicted in FIG. 23, the two-dimensional code may be arranged on a back surface side (center side of the rotator 64, and upper side in FIG. 23) of the suction nozzle 120. In this case, with the nozzle shaft 100 rotated about the axis line L to move the two-dimensional code 125 positioned on the back surface to a front surface (lower side in FIG. 23) of the side frame 165a of the camera unit 150, image-taking by the camera unit 150 can be performed. In this manner, the two-dimensional code 125 is oriented to the back surface at the time of suctioning or mounting the electronic component, thereby making attachment of soiling such as a foreign matter on the front surface of the two-dimensional code 125 difficult.

At the time of nozzle replacement, the suction nozzle 120 is accommodated in the accommodation unit 310 of the nozzle replacing device 300 so that the two-dimensional code 125 is positioned at the front of the camera unit 150, thereby making it possible to save trouble to rotate the nozzle shaft 100 at the time of image-taking and allowing efficient image-taking of the two-dimensional code 125. Also, when image processing is performed on a tip image of the suction nozzle 120, if a recognition process is difficult to perform with the presence of the two-dimensional code 125, the two-dimensional code 125 may be arranged at a position of the suction nozzle 120 where an image thereof is taken simultaneously with a tip image. The same goes for the case in which the arrangement location of the two-dimensional code 125 is restricted, and the two-dimensional code 125 may be arranged at a non-restrictive position.

While the embodiments have been described in detail in the foregoing, these are merely examples and are not meant to limit the scope of claims. The technology described in the scope of claims includes those acquired by variously modifying and changing the specific examples exemplarily described above.

The invention claimed is:

1. A component mounting device which mounts an electronic component on a printed circuit board, including:
   a sideview camera configured to take an image of a side surface of a target;
   a mounting head having at least one nozzle shaft, each nozzle shaft including
      a shaft main body movably supported to a vertical direction with respect to the mounting head,
      a suction nozzle attached at a tip of the shaft main body to suction and hold the electronic component, and
      an identification mark which identifies the suction nozzle and is provided on a side surface of the suction nozzle; and
   a motor configured to move the mounting head to a planar direction on a base, wherein
   the sideview camera is arranged on the mounting head, and is configured to take an image of the identification mark of the suction nozzle, and
   each nozzle shaft is configured to vertically move with respect to the mounting head between a first position where an image of the electronic component held by the suction nozzle can be taken by the sideview camera and a second position where the image of the identification mark attached to the side surface of the suction nozzle can be taken by the sideview camera.

2. The component mounting device according to claim 1, wherein
   the mounting head has more than one of the nozzle shafts,
   the mounting head is a rotary-type mounting head including
      a rotator having the nozzle shafts arranged in a circumferential direction, and
      a support member rotatably supporting the rotator, and
   the sideview camera is attached to the support member.

3. The component mounting device according to claim 2, wherein
   the identification mark is a two-dimensional code.

4. The component mounting device according to claim 1, wherein
   the identification mark is a two-dimensional code.

5. A component mounting device which mounts an electronic component on a printed circuit board, including:
   a sideview camera configured to take an image of a side surface of a target;
   a mounting head having at least one nozzle shaft, each nozzle shaft including
      a shaft main body movably supported to a vertical direction with respect to the mounting head,
      a suction nozzle attached at a tip of the shaft main body to suction and hold the electronic component, and
      an identification mark which identifies the suction nozzle and is provided on a side surface of the suction nozzle, wherein
   the sideview camera is arranged on the mounting head, and is configured to take an image of the identification mark of the suction nozzle, and
   each nozzle shaft is configured to vertically move with respect to the mounting head between a first position where an image of the electronic component held by the suction nozzle can be taken by the sideview camera and a second position where the image of the identification mark attached to the side surface of the suction nozzle can be taken by the sideview camera.

6. The component mounting device according to claim 5, wherein
   the mounting head has more than one of the nozzle shafts,
   the mounting head is a rotary-type mounting head including
      a rotator having the nozzle shafts arranged in a circumferential direction, and
      a support member rotatably supporting the rotator, and
   the sideview camera is attached to the support member.

7. The component mounting device according to claim 6, wherein
   the identification mark is a two-dimensional code.

8. The component mounting device according to claim 5, wherein
   the identification mark is a two-dimensional code.

* * * * *